United States Patent
Goh et al.

(10) Patent No.: US 8,502,801 B2
(45) Date of Patent: Aug. 6, 2013

(54) CAPACITIVE TOUCH SENSOR SYSTEM

(75) Inventors: Hup-Peng Goh, Singapore (SG);
Shantonu Bhadury, Singapore (SG);
Kusuma Adi Ningrat, Singapore (SG);
Chee Yu Ng, Singapore (SG); Giuseppe Noviello, Singapore (SG)

(73) Assignee: STMicroelectronics Asia Pacific Pte Ltd., Singapore (SG)

( * ) Notice: Subject to any disclaimer, the term of this patent is extended or adjusted under 35 U.S.C. 154(b) by 943 days.

(21) Appl. No.: 12/428,475

(22) Filed: Apr. 23, 2009

(65) Prior Publication Data
US 2010/0053097 A1    Mar. 4, 2010

Related U.S. Application Data

(63) Continuation-in-part of application No. 12/200,567, filed on Aug. 28, 2008.

(51) Int. Cl.
*G06F 3/045* (2006.01)

(52) U.S. Cl.
USPC ............ 345/174; 345/173; 327/261; 327/262

(58) Field of Classification Search
None
See application file for complete search history.

(56) References Cited

U.S. PATENT DOCUMENTS

| | | | |
|---|---|---|---|
| 5,825,352 A | 10/1998 | Bisset et al. | |
| 8,023,363 B2 * | 9/2011 | Huang et al. | 368/118 |
| 2005/0189154 A1 | 9/2005 | Perski et al. | |
| 2006/0012580 A1 | 1/2006 | Perski et al. | |
| 2006/0097991 A1 | 5/2006 | Hotelling et al. | |
| 2007/0085570 A1 * | 4/2007 | Matsuta | 327/3 |
| 2007/0171211 A1 | 7/2007 | Perski et al. | |
| 2007/0263732 A1 * | 11/2007 | Yamauchi et al. | 375/242 |
| 2008/0012835 A1 | 1/2008 | Rimon et al. | |
| 2008/0111714 A1 * | 5/2008 | Kremin | 341/33 |
| 2008/0150715 A1 | 6/2008 | Tang et al. | |
| 2009/0056448 A1 * | 3/2009 | Lee et al. | 73/514.32 |
| 2009/0141770 A1 * | 6/2009 | Chen et al. | 374/170 |
| 2009/0273384 A1 * | 11/2009 | Kojima et al. | 327/262 |

* cited by examiner

*Primary Examiner* — Lixi C Simpson
(74) *Attorney, Agent, or Firm* — Hogan Lovells US LLP

(57) ABSTRACT

A method of matrix sensing using delay-based capacitance sensing, including using X-axis lines as active lines for capacitance measurements and using Y-axis lines as a disturbance to identify the location of a touch in a key matrix is disclosed. A sensing signal is applied to the X-axis lines, and a disturbance signal is applied to the Y-axis lines. If a location is touched, cross-capacitance is reduced, which is measured by sweeping data along the X-axis lines.

21 Claims, 31 Drawing Sheets

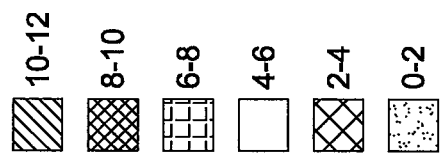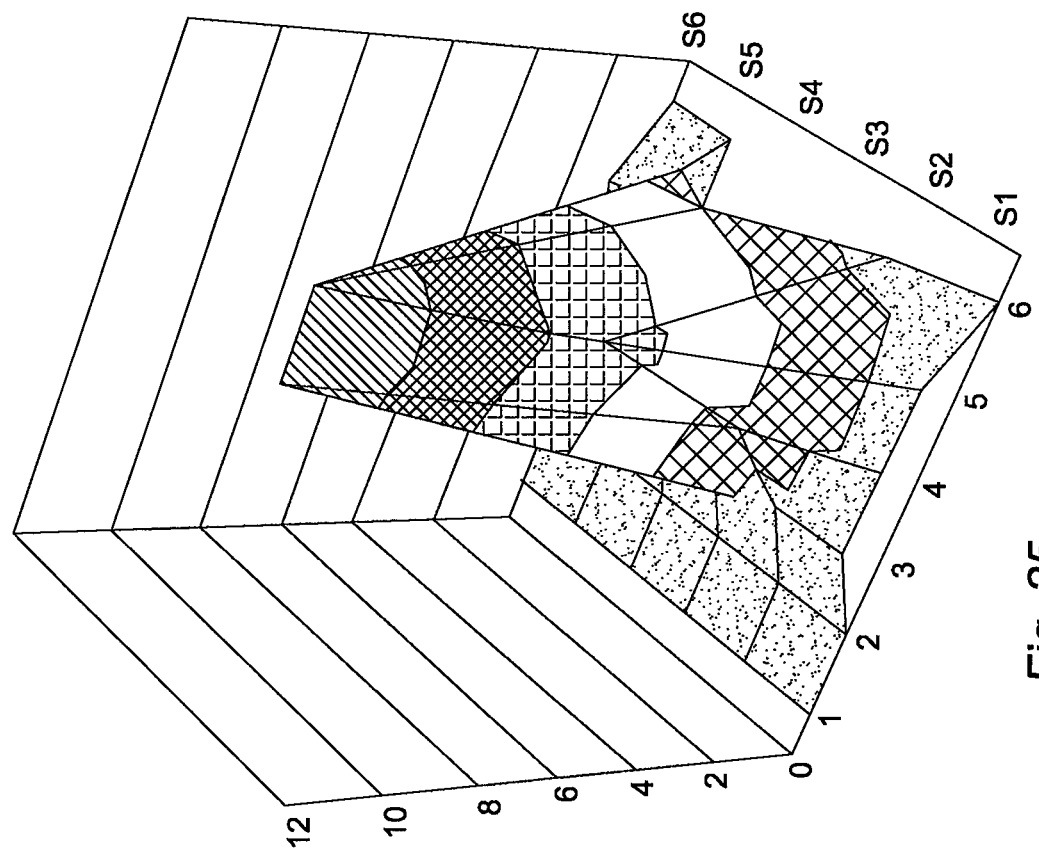
Fig. 25

CAPACITIVE TOUCH SENSOR SYSTEM

RELATED APPLICATIONS

This application is a continuation in part and claims the benefit of application Ser. No. 12/200,567, filed Aug. 28, 2008, the disclosure of which is herein specifically incorporated by this reference.

FIELD OF THE INVENTION

The present invention relates to a capacitive touch sensor system including a touch pad or touch screen and a corresponding method of operation.

BACKGROUND OF THE INVENTION

Capacitive touch sensors are prone to noise, environmental variation, PCB variation and device lot variation. For a multi-touch touch-screen application, a force and sense sensing front-end is required. This front-end measures cross-capacitance in the X-axis and Y-axis of a projected capacitive touch-screen structure. A robust noise filtering technique is also required to reduce the effect of external noise which is easily coupled to the sensor. A calibration system which is able to offset the effect of environmental variation, PCB variation and device lot variation is also required. The capacitive touch sensor system of the present invention provides a novel solution to meet the above-mentioned requirements.

BRIEF DESCRIPTION OF THE DRAWINGS

The present invention is illustrated by way of example and not by limitation in the accompanying figures in which like reference numerals indicate similar elements and in which:

FIGS. 25-27 are three-dimensional plots illustrating the experimental results of single, double, and triple disturbance sensing touch profiles according to the present invention;

DETAILED DESCRIPTION

Figure 1:
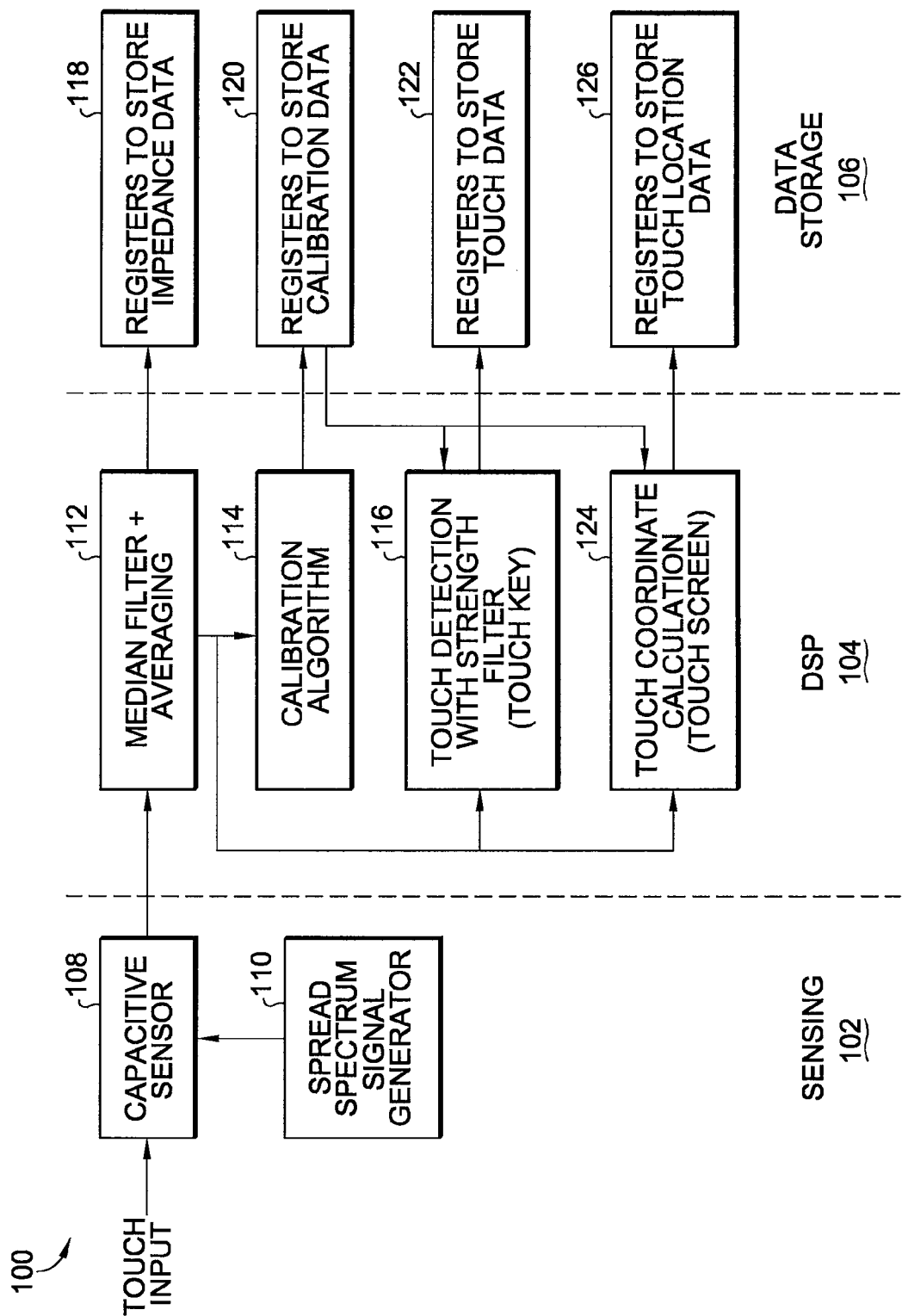
FIG. 1 is a complete diagram of the capacitive touch sensor system of the present invention.

Referring now to FIG. 1, a block diagram of the complete system 100 according to the present invention is shown. The complete system includes a sensing portion 102, a DSP portion 104, and a data storage portion 106. The sensing portion 102 includes a capacitive sensor 108 for receiving the touch inputs, as well as inputs from the spread spectrum signal generator 110. The output of the capacitive sensor 108 is sent to the DSP portion 104. The DSP portion 104 includes a median filter and averaging block 112, in communication with a calibration algorithm block 114, a touch detection with strength filter block (for touch-key) 116, and a touch location calculation (for touch-screen) block 124. The outputs of blocks 112, 114, 116, and 124 are sent to the data storage block 106. The data storage block 106 includes registers 118 to store impedance data from block 112, registers 120 to store calibration data from block 114, registers 122 to store touch data from block 116, and register 126 to store touch coordinate. Register 120 also provides data to block 116 and 124.

While an overall block diagram is shown in FIG. 1, further details of the structure and operation of the components associated with the block diagram are explained below with reference to FIGS. 2-28.

Figure 2:
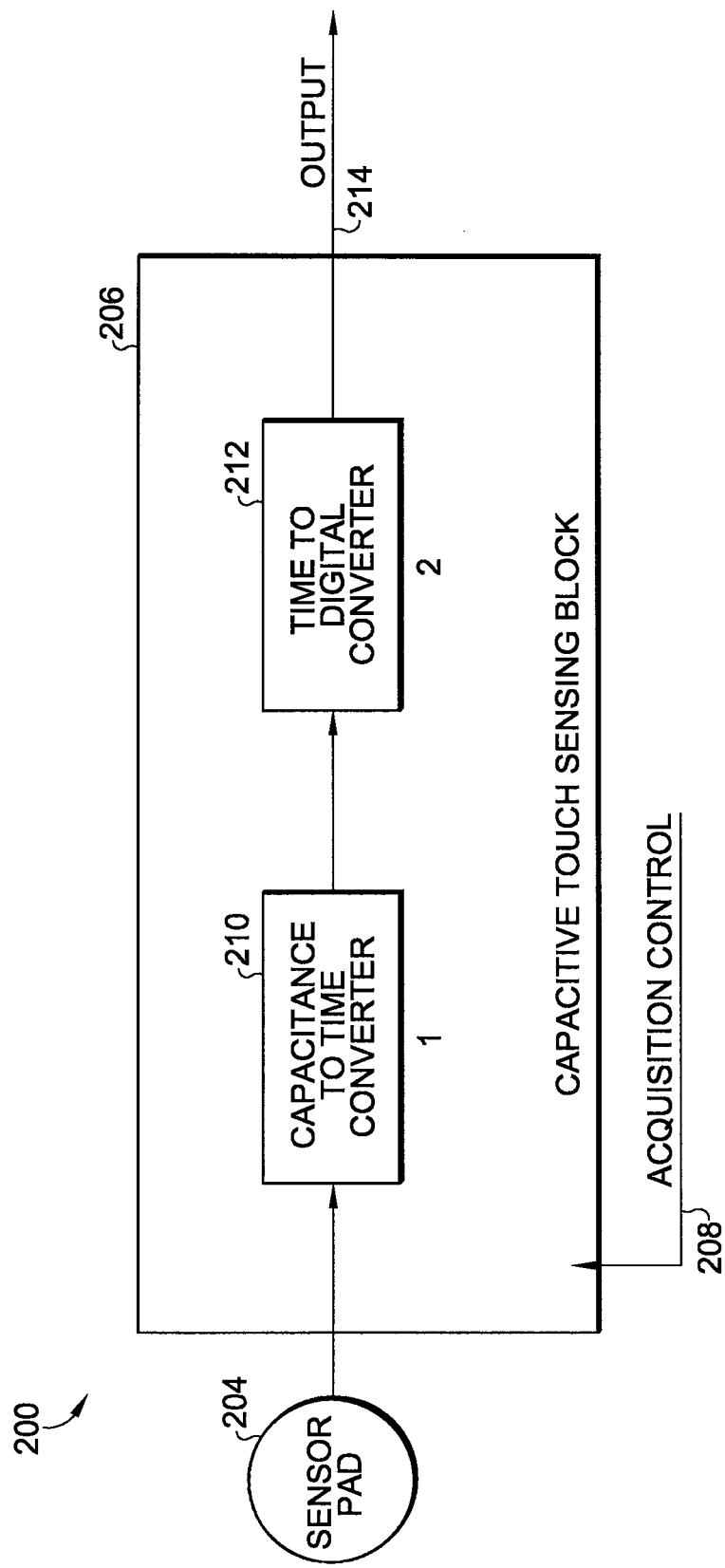
FIG. 2 is a block diagram of the touch sensing portion of the capacitive touch sensor system of the present invention.

Referring now to FIG. 2, a touch-sensing front-end 200 is shown in block diagram form including a main capacitive-touch sensing block 206, including a capacitance-to-time converter block 210 in communication with a time-to-digital converter block 212. An acquisition control signal 208 gives a command signal to the capacitive-touch sensing block 206 at the exact time required to measure the capacitance; this signal is produced by Spread Spectrum generator block 314. The capacitance-to-time converter 210 receives an input from a sensor pad 204. The time-to-digital converter 212 provides an output 214. The capacitance-to-time converter 210 can use an RC structure that converts the sensor pad 204 capacitance to time (either delay or rise/fall time) proportionally to the measured capacitance. The time-to-digital converter can use a delay chain implementation.

Figure 3A:
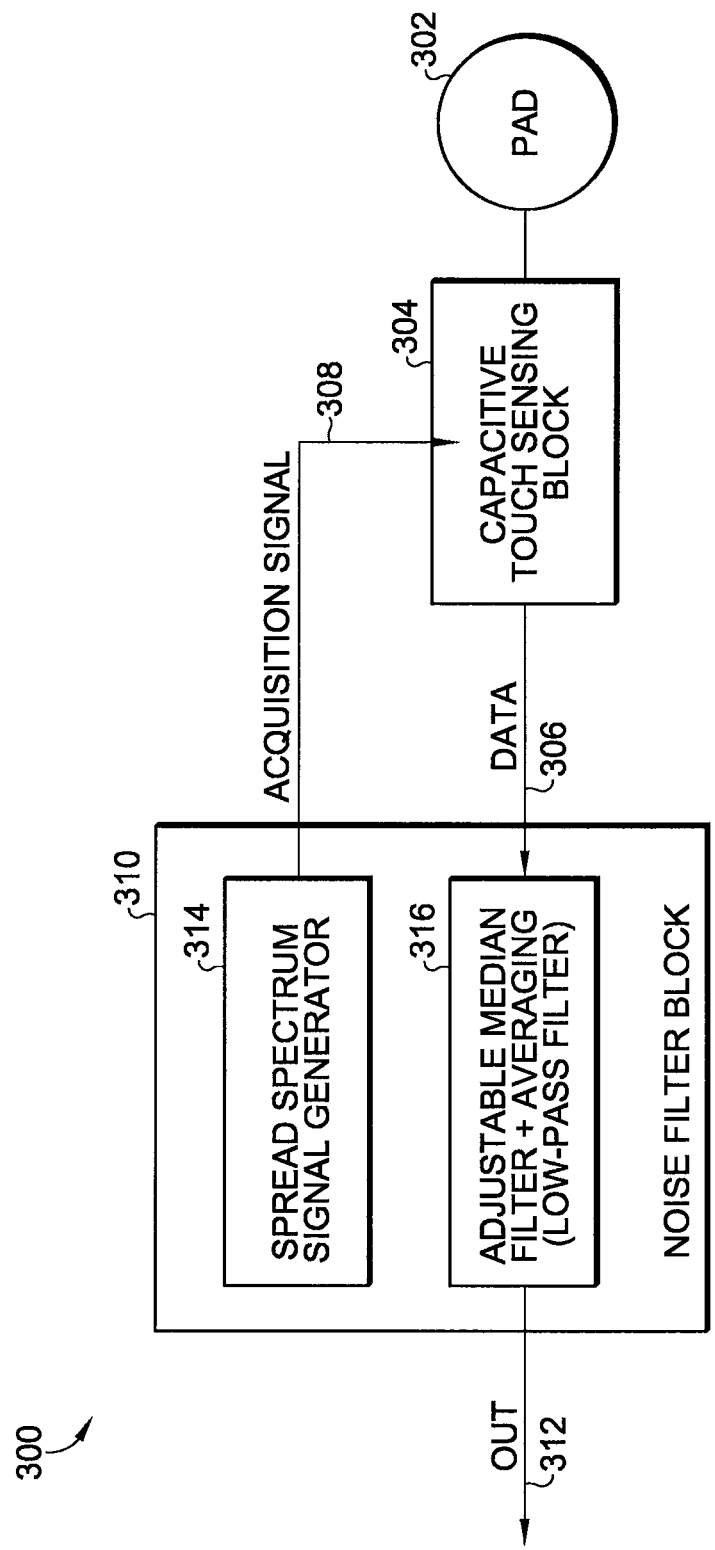
FIG. 3A is a block diagram of a noise filter for the capacitive touch sensor system of the present invention.

Referring now to FIG. 3A, a block diagram of a noise filter 300 for use in the present invention is shown. The main noise filtering block 310 includes a spread spectrum signal generator 314 for providing an acquisition signal to the capacitive-touch sensing block 304 that provides a command to acquire data. Noise filtering block 310 also includes an adjustable median filter plus averaging (low pass filter) block 316 for receiving data 306 from block 304 and for providing filtered data at output 312. The capacitive-touch sensing block 304 receives capacitance information from pad 302 as explained above.

Figure 3B:
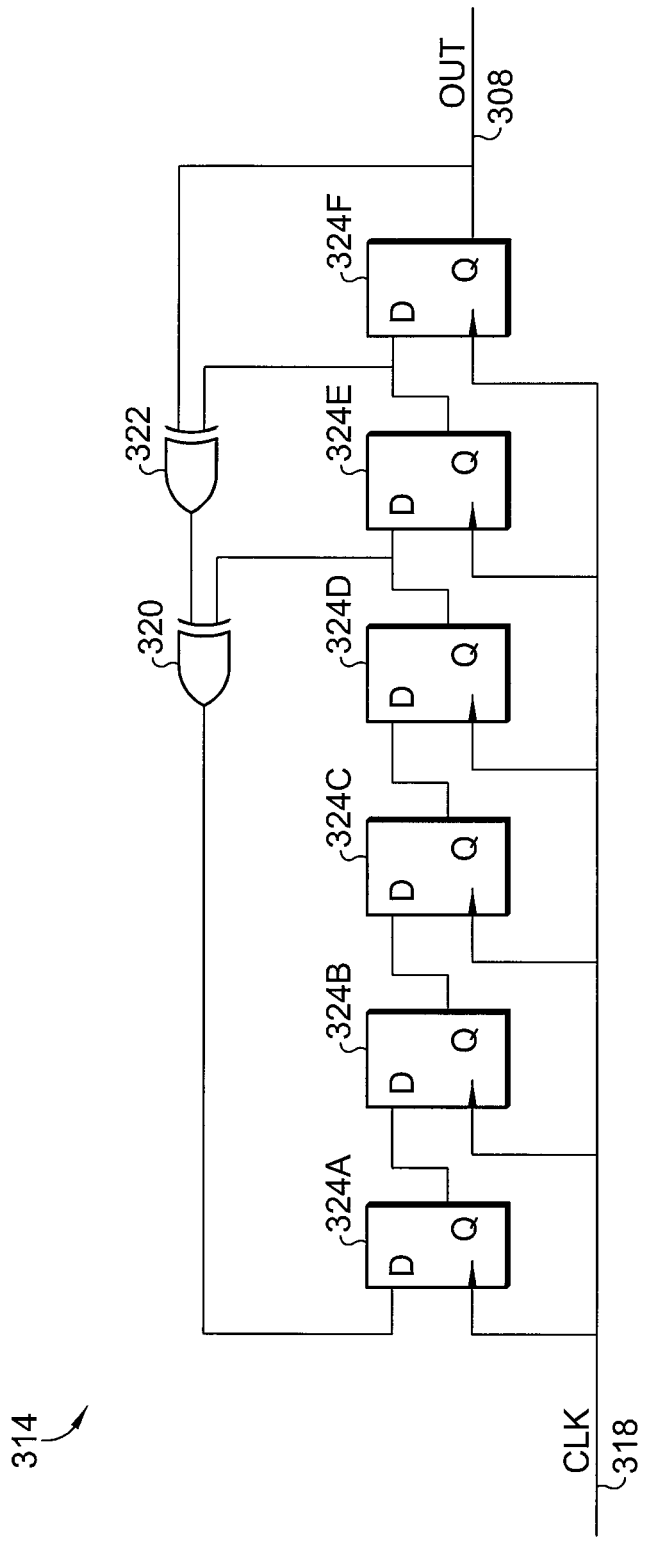
FIG. 3B is a schematic diagram of a spread spectrum signal generator associated with the noise filter of FIG. 3A.

Referring now to FIG. 3B, the spread spectrum signal generator 314 can be realized by a relatively simple circuit including a plurality of D-type flip-flops 324 receiving a CLK input signal at node 318 and XOR gates 320 and 322, which generates a pseudo-random signal at output 308. The rising edge of the output signal at node 308 is used as a trigger for the capacitive touch sensing block to acquire data. This ensures that the capacitive data acquisition is performed in a "pseudo-random" manner.

Figure 3C:
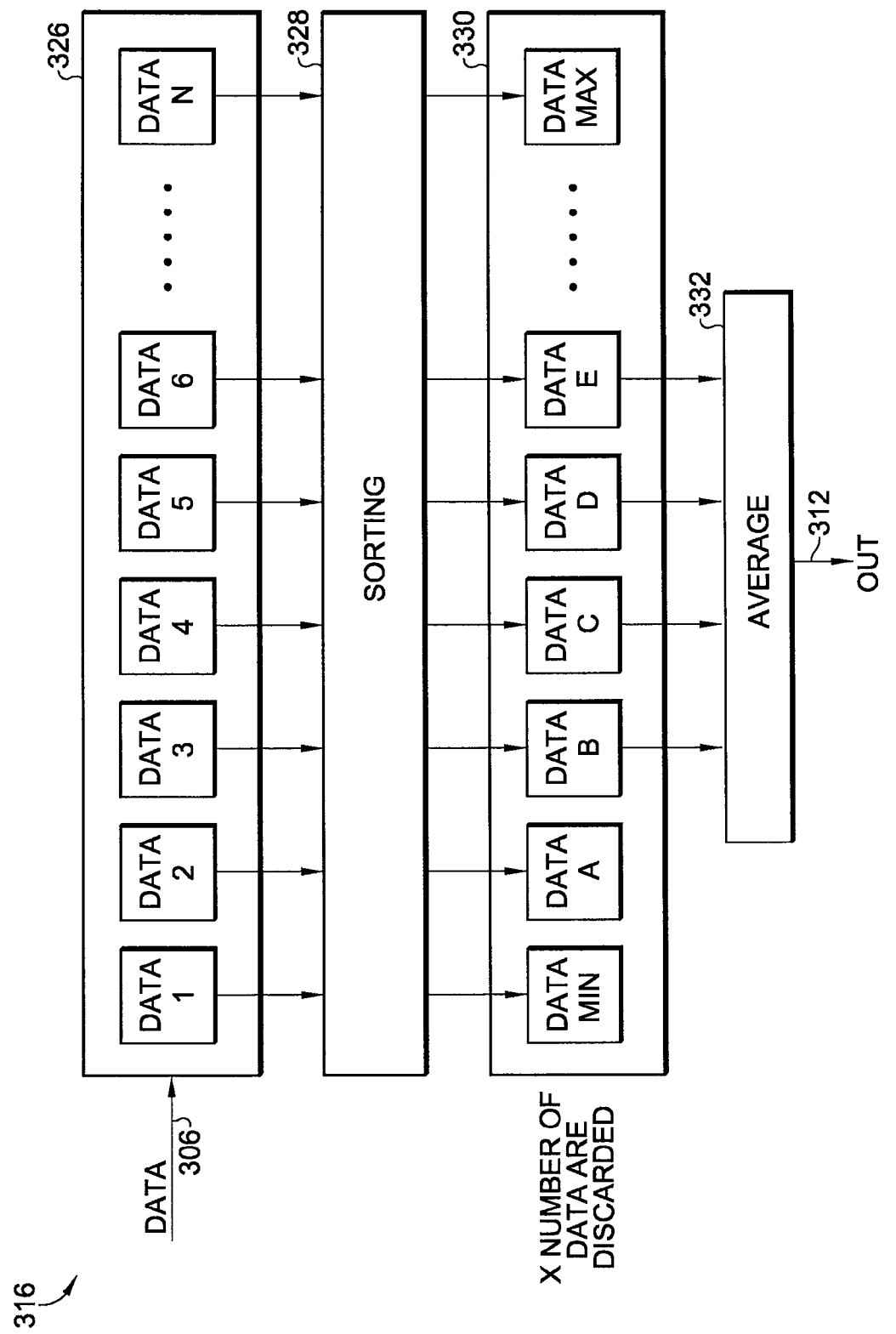
FIG. 3C is a block diagram of a median filter and averaging block associated with the noise filter of FIG. 3A.

Referring now to FIG. 3C, filter block 316 can be implemented using data block 326, sorting block 328, data block 330, and averaging block 332. Data block 326 receives the input data at node 306, and averaging block 332 provides the output data at node 312. Data block 326 includes unsorted "Data 1" through "Data N" and data block 330 includes sorted "Data mm" through "Data max", wherein N number of data entries are populated and then sorted from the minimum value to the maximum value. A predetermined number of minimum data entries and maximum data entries are discarded. The remaining data entries are averaged by the averaging block 332 to provide the averaged data output at node 312. The number of data entries, N, and the number of predetermined minimum and maximum data discards are completely adjustable to adapt to a particular noise characteristic environment. For example, if shot noise is more frequent, then the predetermined number of discards can be increased. If the magnitude of random/periodic noise is bigger, than the total number of data entries, N, can be increased.

Figure 4:
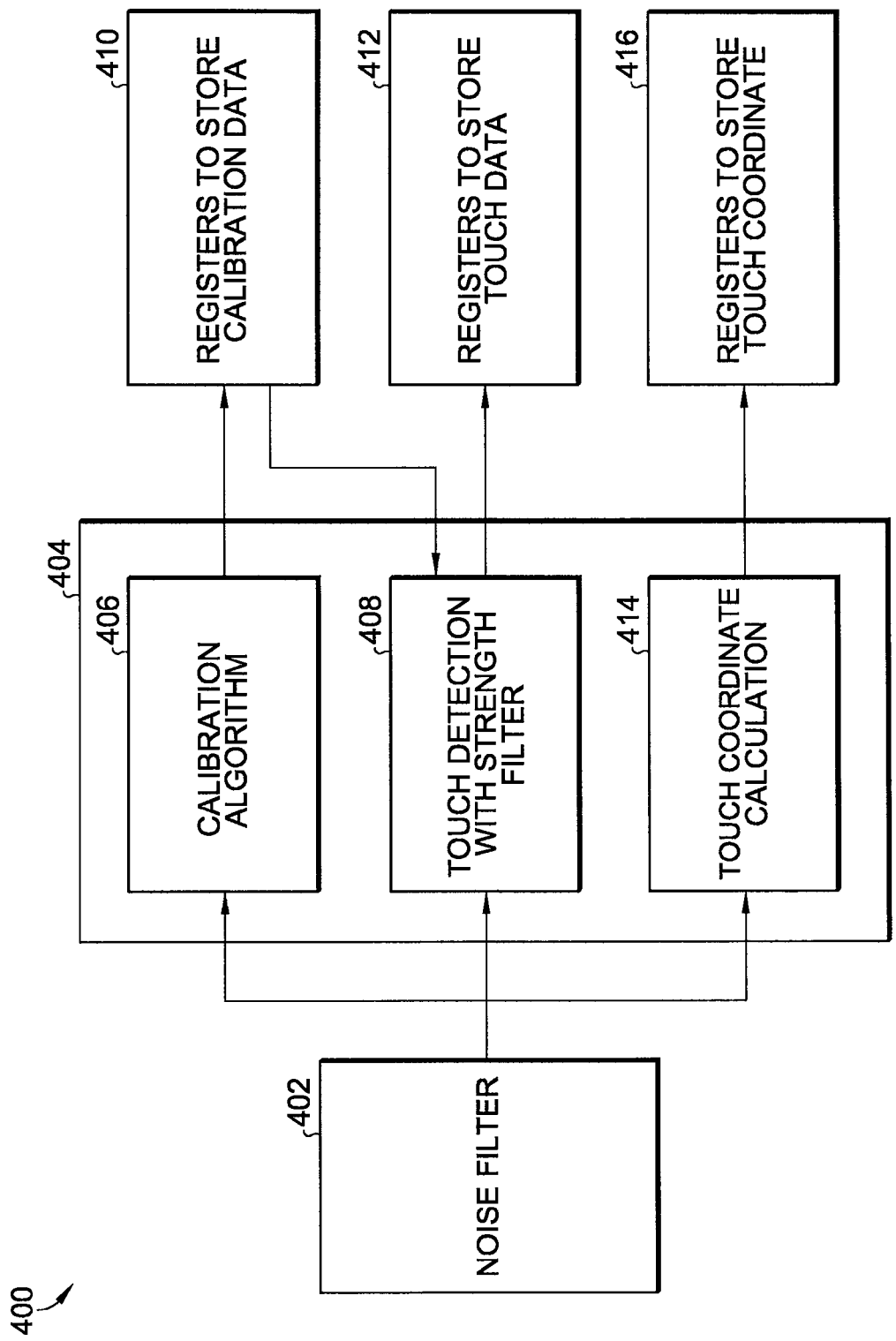
FIG. 4 is a block diagram of a data processing block for the capacitive touch sensor system of the present invention.

Referring now to FIG. 4, a block diagram of a data processing block 400 according to the present invention includes a noise filter 402, processing block 404, and registers 410, 412, and 416. The output of noise filter 402 is coupled to processing block 404, which includes a calibration block 406, a touch detection block 408, and a touch coordinate calculation block 414. The output of the calibration block 406 is coupled to the input of registers 410, which are used to store calibration data. The output of registers 410 are coupled to an input of the touch detection block 408. Registers 412 store the touch data provided by the output of touch detection block 408. Registers 416 store the touch coordinate calculation data provided by the output of block 414.

FIGS. 1-4 provide the basic context of the capacitive touch sensor system according to the present invention. The system generally comprises three main blocks. A Capacitive Touch Sensing block converts capacitance into digital data. Noise Filter blocks utilize a spread spectrum signal to randomize the data acquisition and perform median filtering and averaging. The output is "clean" data that is ready to be processed by a DSP block (calibration, touch detection or touch coordinate calculation).

Figure 5:
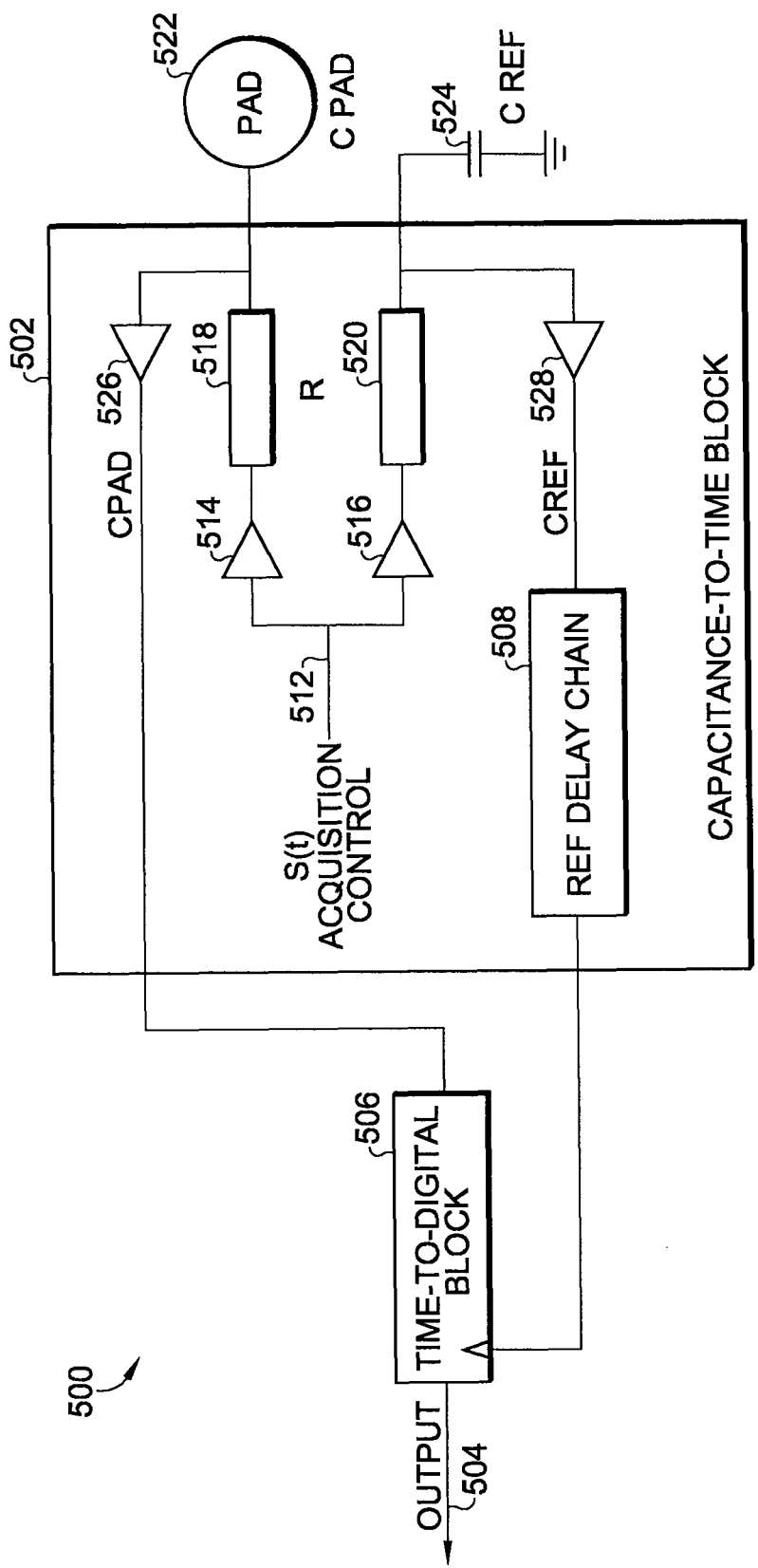
FIG. 5 is a block diagram of a high speed delay-based capacitance measurement front-end for the capacitive touch sensor system of the present invention.
Figure 6:
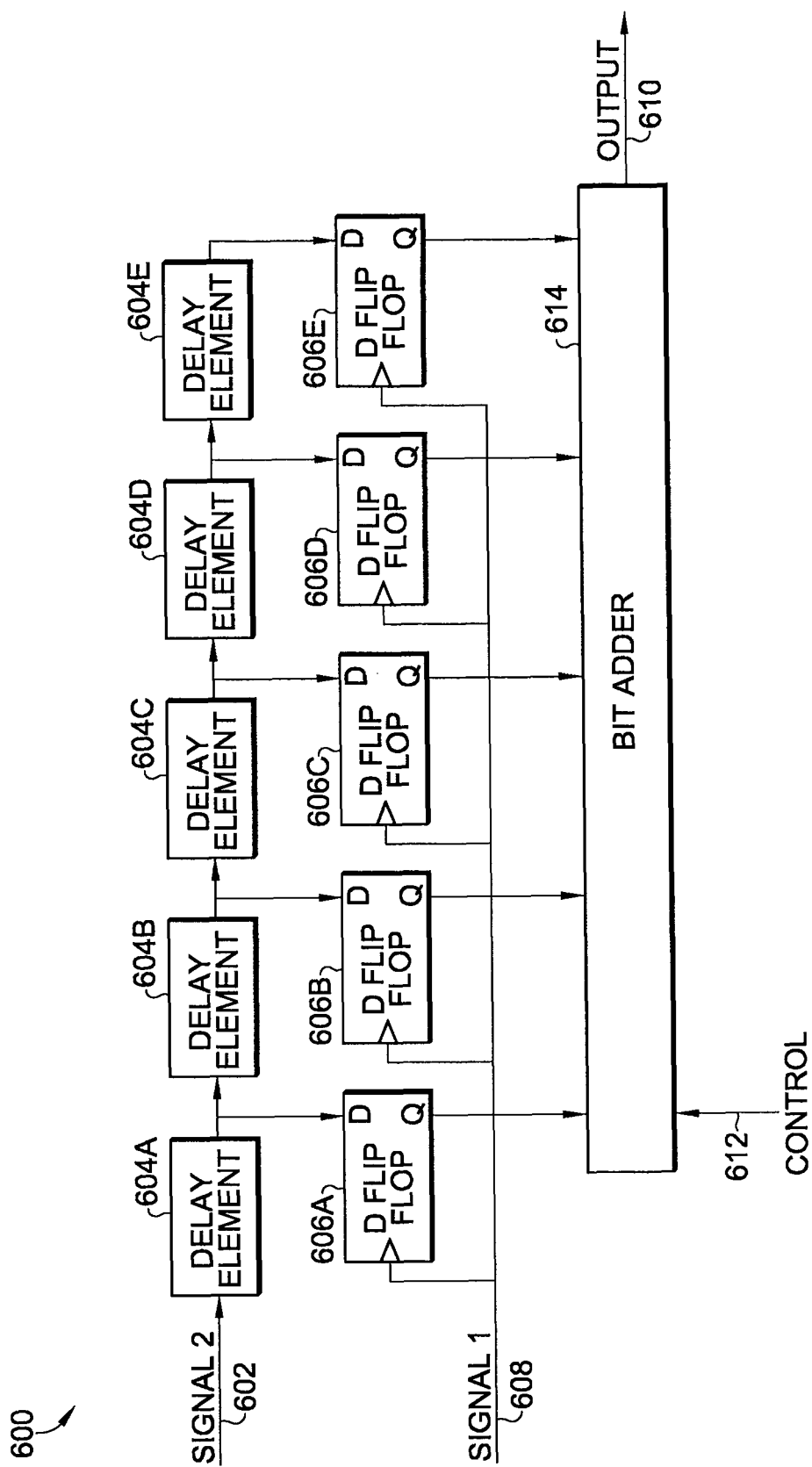
FIG. 6 is a block diagram of a delay chain used in the measurement front-end shown in FIG. 5.
Figure 7:
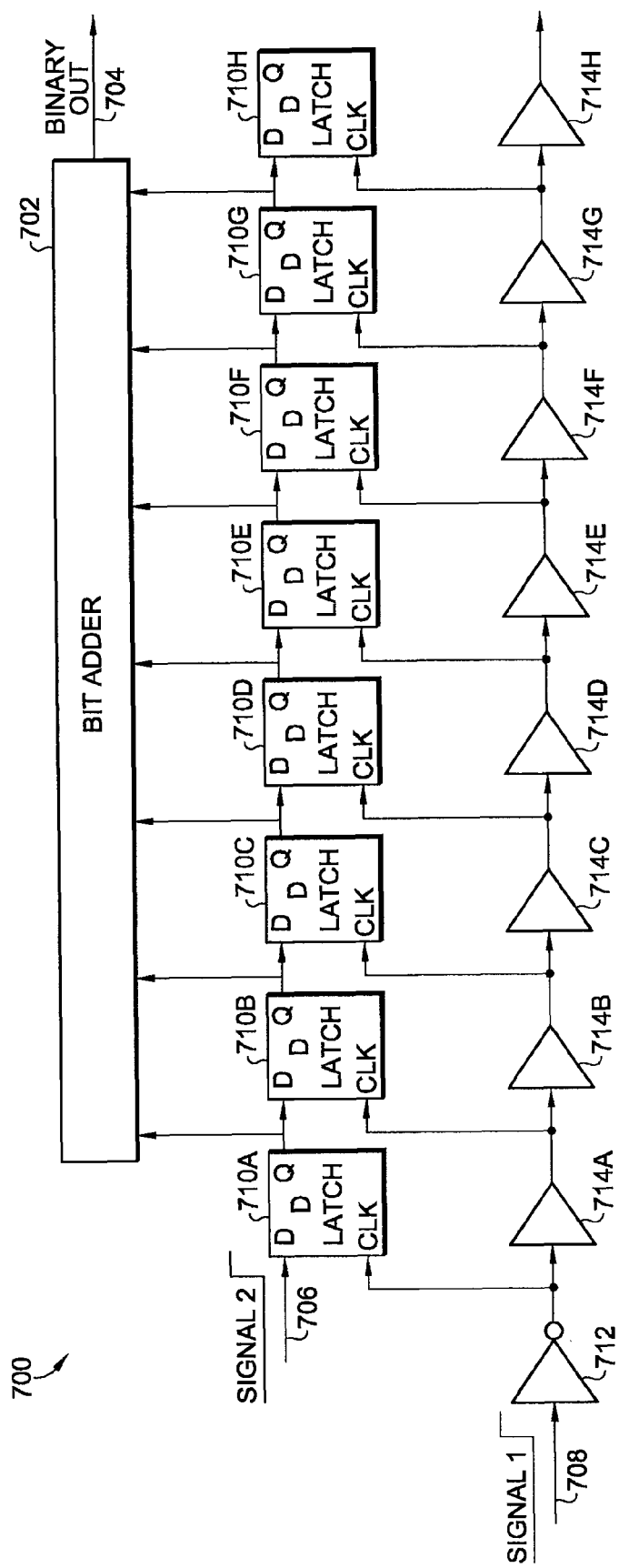
FIG. 7 is a block diagram of an alternative delay chain used in the measurement front-end shown in FIG. 5.
Figure 13:
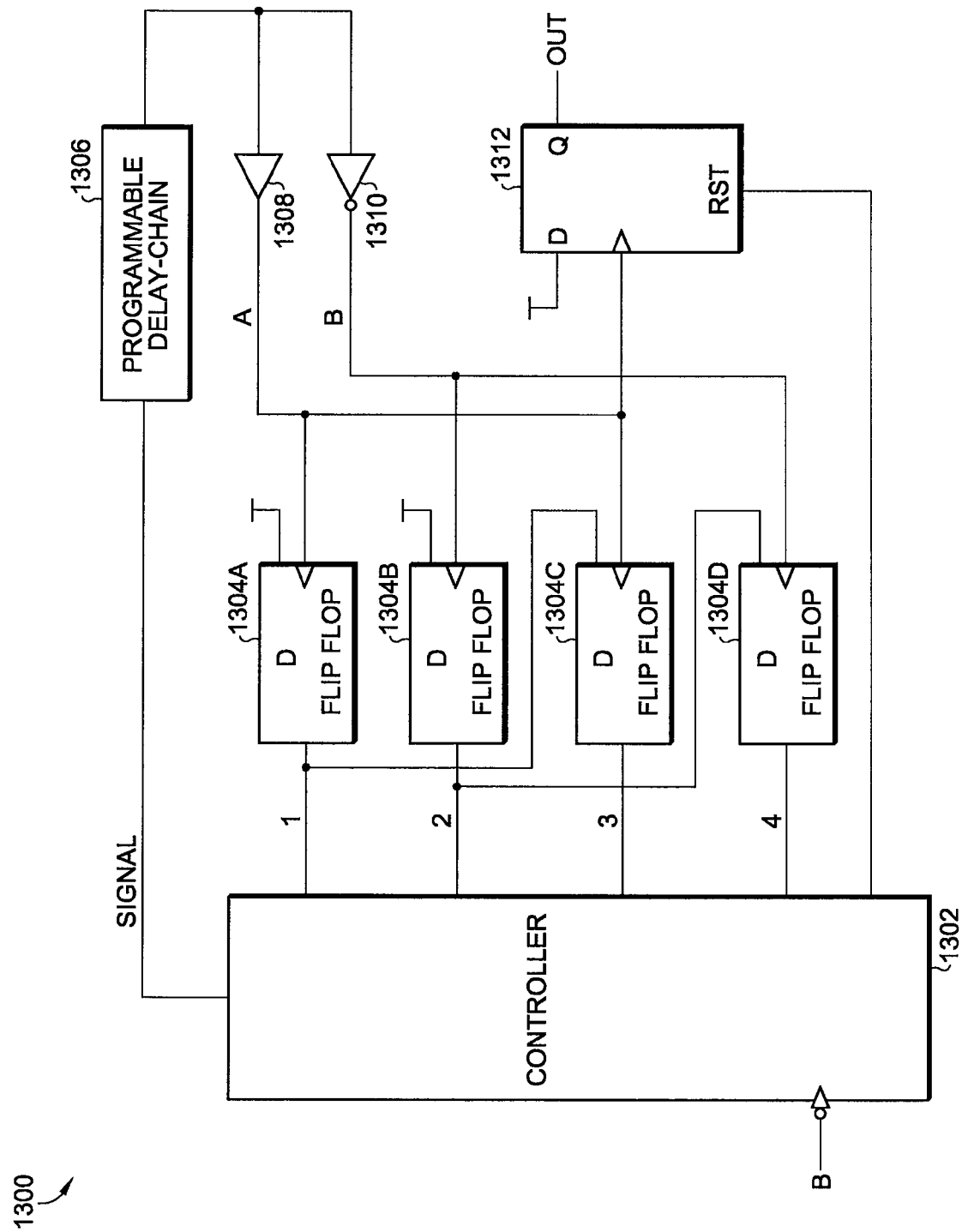
FIG. 13 is a schematic diagram of a time offset block associated with the circuit of FIG. 10, according to the present invention.
Figure 14:
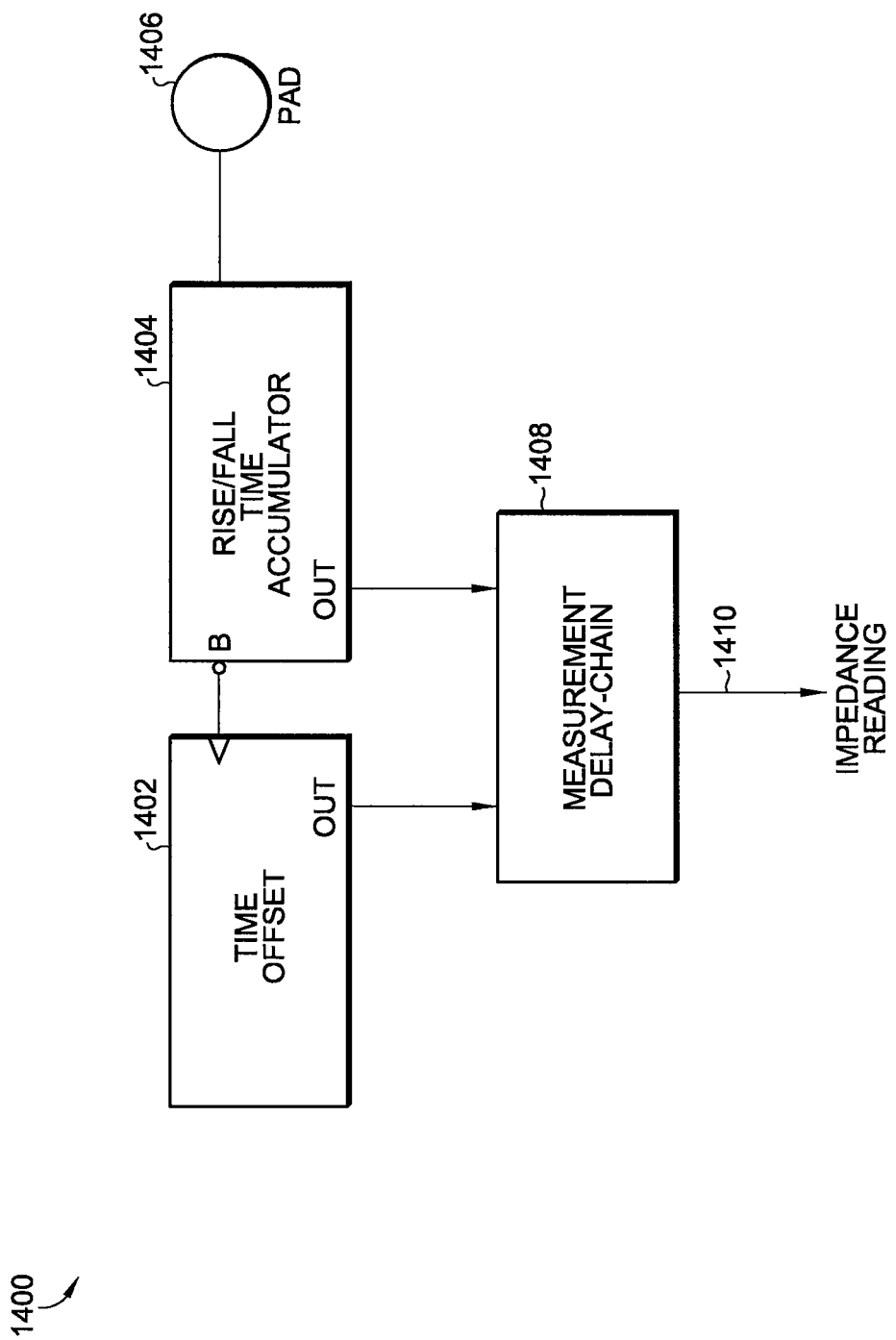
FIG. 14 is an overall block diagram of the rise/fall time accumulator according to the present invention.
Figure 15:
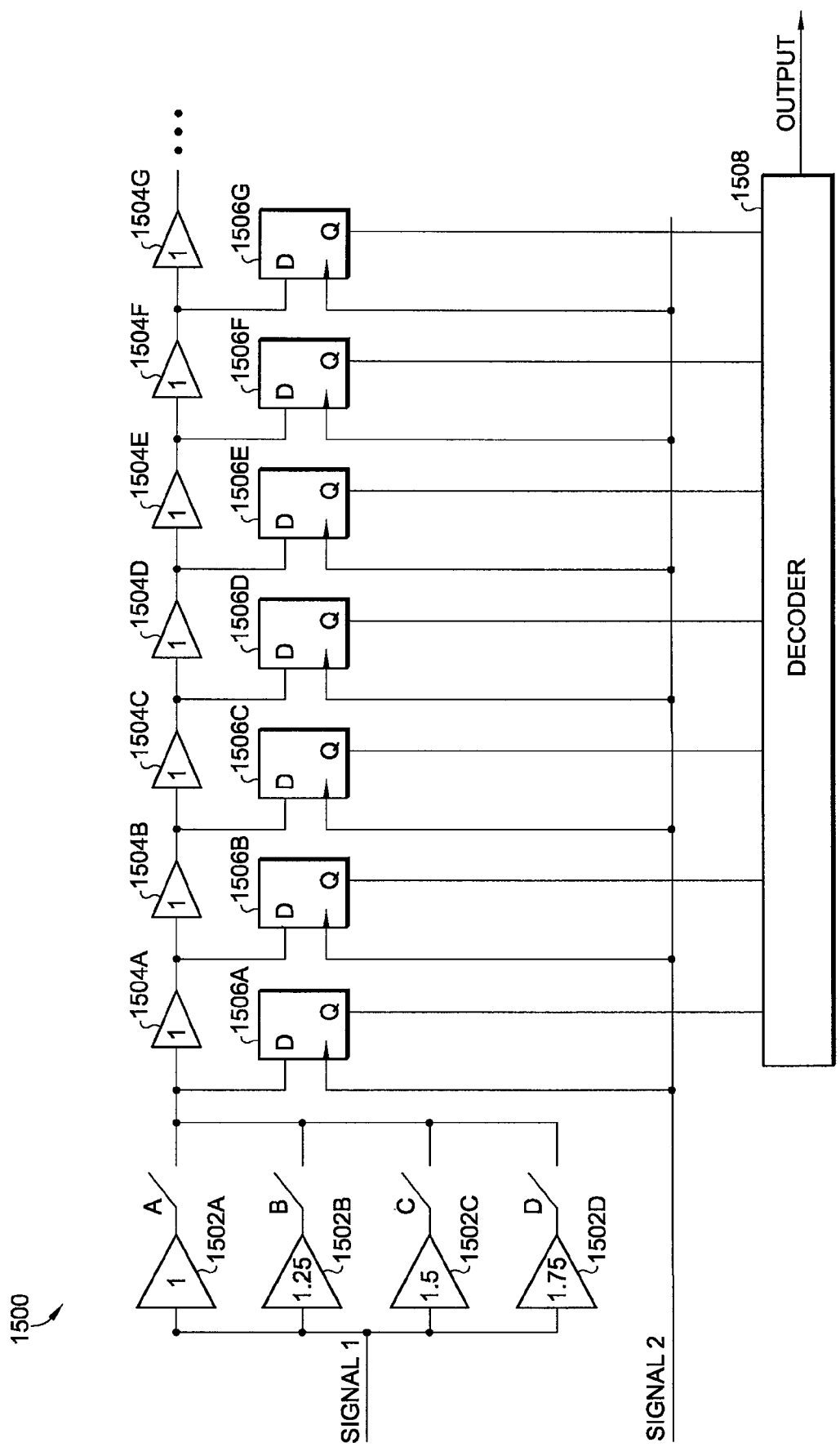
FIG. 15 is a block diagram of a fractional-bit insertion circuit according to the present invention.

FIGS. 5 and 8-14 show various implementations of the Capacitance-to-Time block, while FIGS. 6, 7 and 15 show various implementations of the Time-to-Digital block.

FIG. 5 shows the basic structure of the Capacitance-to-Time block that utilizes an RC structure, the capacitance difference between CPAD and CREF is represented by the delay between CREF and CPAD signal.

Figure 8:
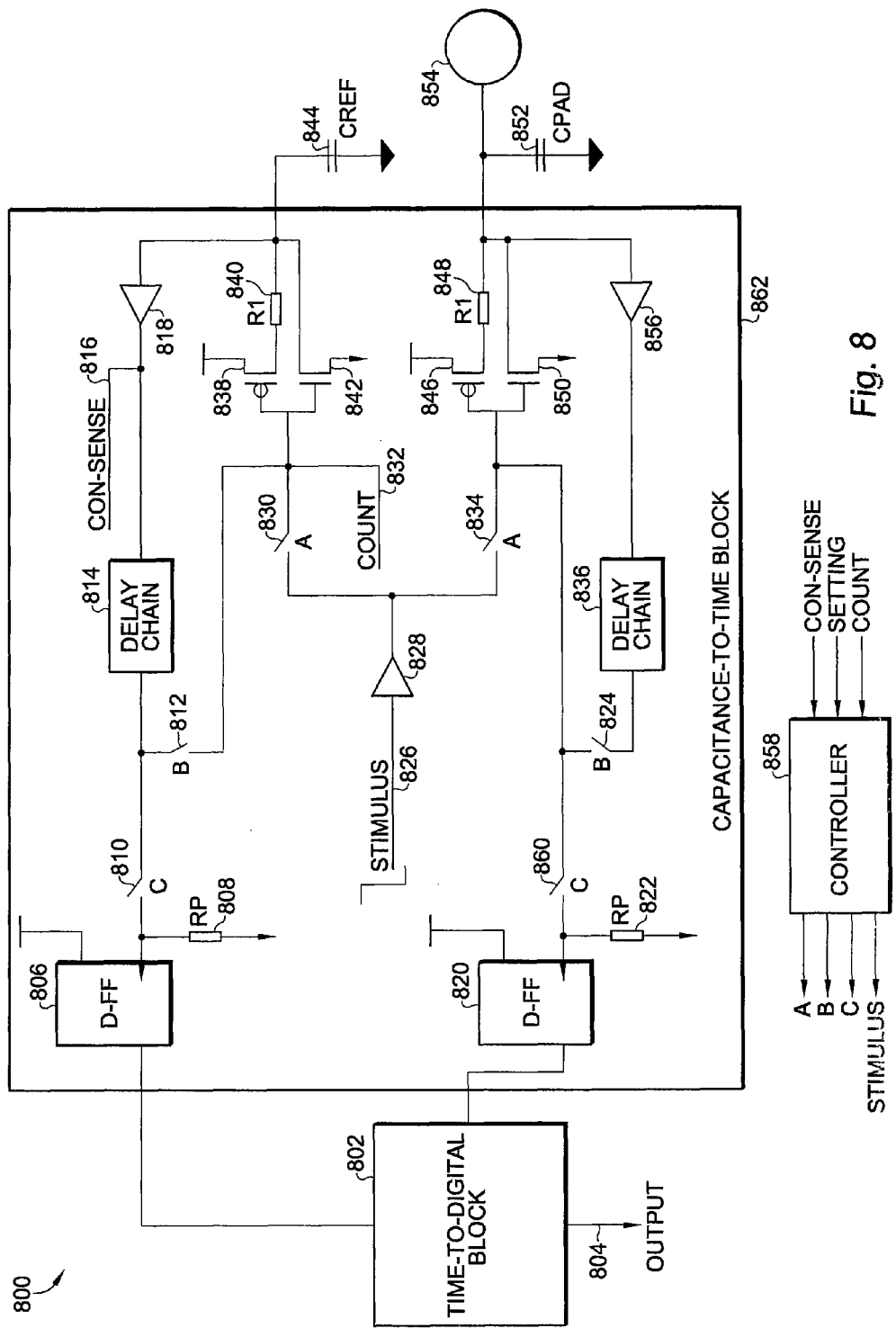
FIG. 8 is a schematic diagram of a delay accumulator utilizing a ring oscillator structure for a capacitance sensing front-end according to the present invention.

FIG. 8 is the improved version of the circuit of FIG. 5, which is able to perform accumulation of delay between CREF and CPAD (linear with CPAD and CREF capacitance difference) in a specific number of cycles, hence the sensitivity of the sensing can be controlled.

Figure 9:
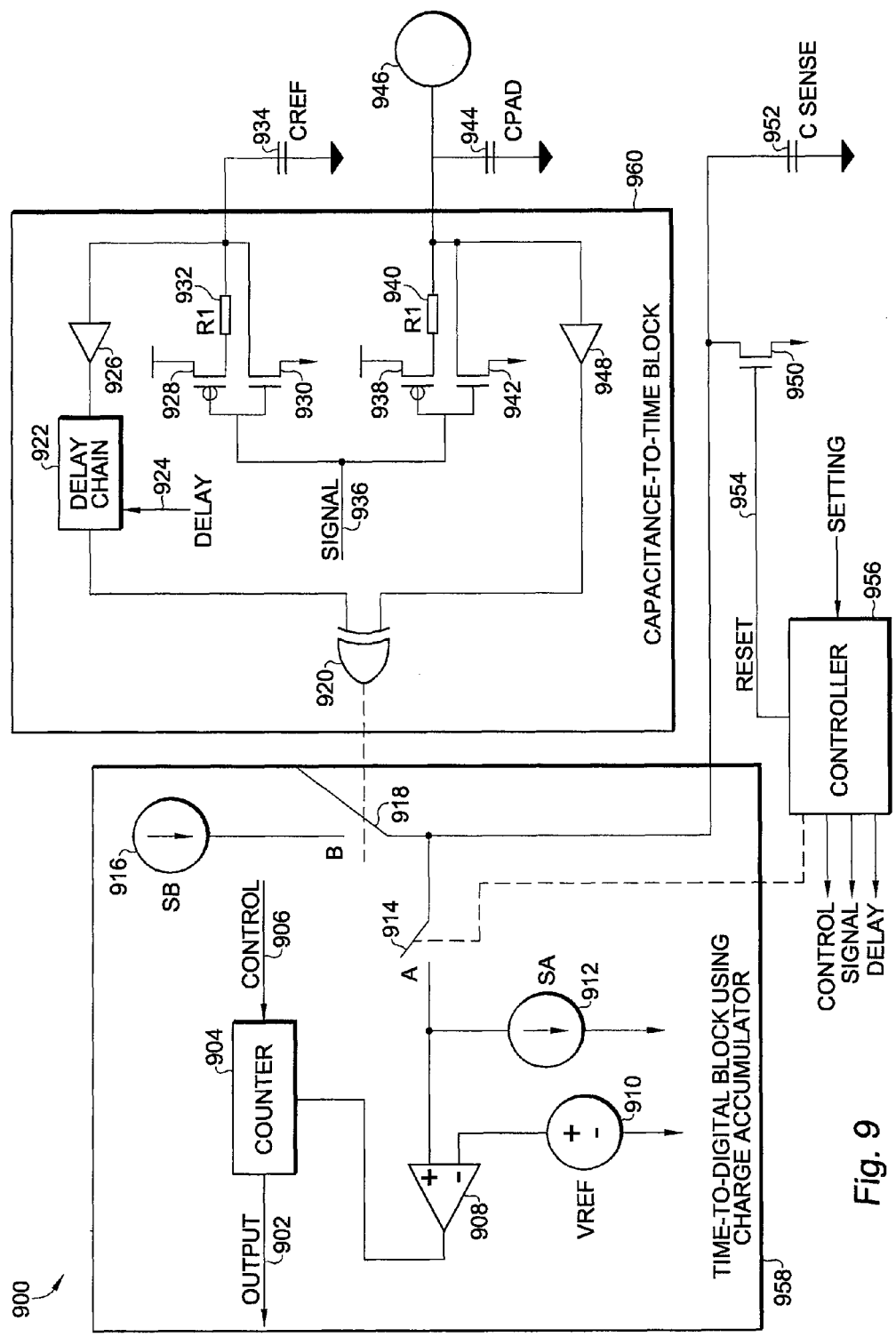
FIG. 9 is a schematic diagram of a charge accumulator delay-based capacitive sensing front-end according to the present invention.

FIG. 9 is similar to the circuit of FIG. 6, but the accumulation of the delay time is done by accumulating charge in an external sensing capacitance. Each delay between CPAD and CREF signal will turn on a current source that charges the sensing capacitor, hence the charge accumulated in it is the representation of capacitance difference between CPAD and CREF.

FIGS. 10-14 show another implementation of the Capacitance-to-Delay block, which measures rise/fall time of the signal; no reference signal is required, but offset time is used instead. Sensitivity of this implementation is also adjustable.

Figure 17:
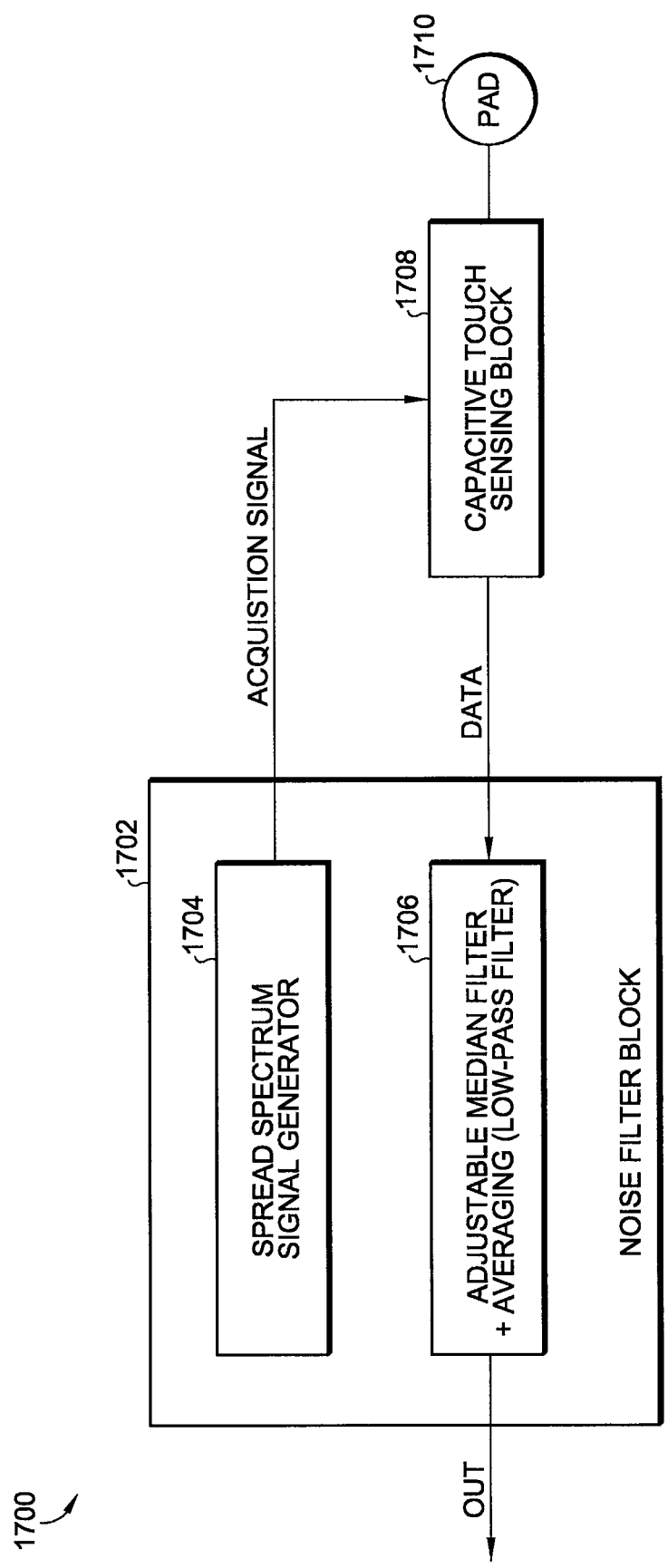
FIG. 17 is a block diagram of a noise filter according to the present invention.
Figure 18:
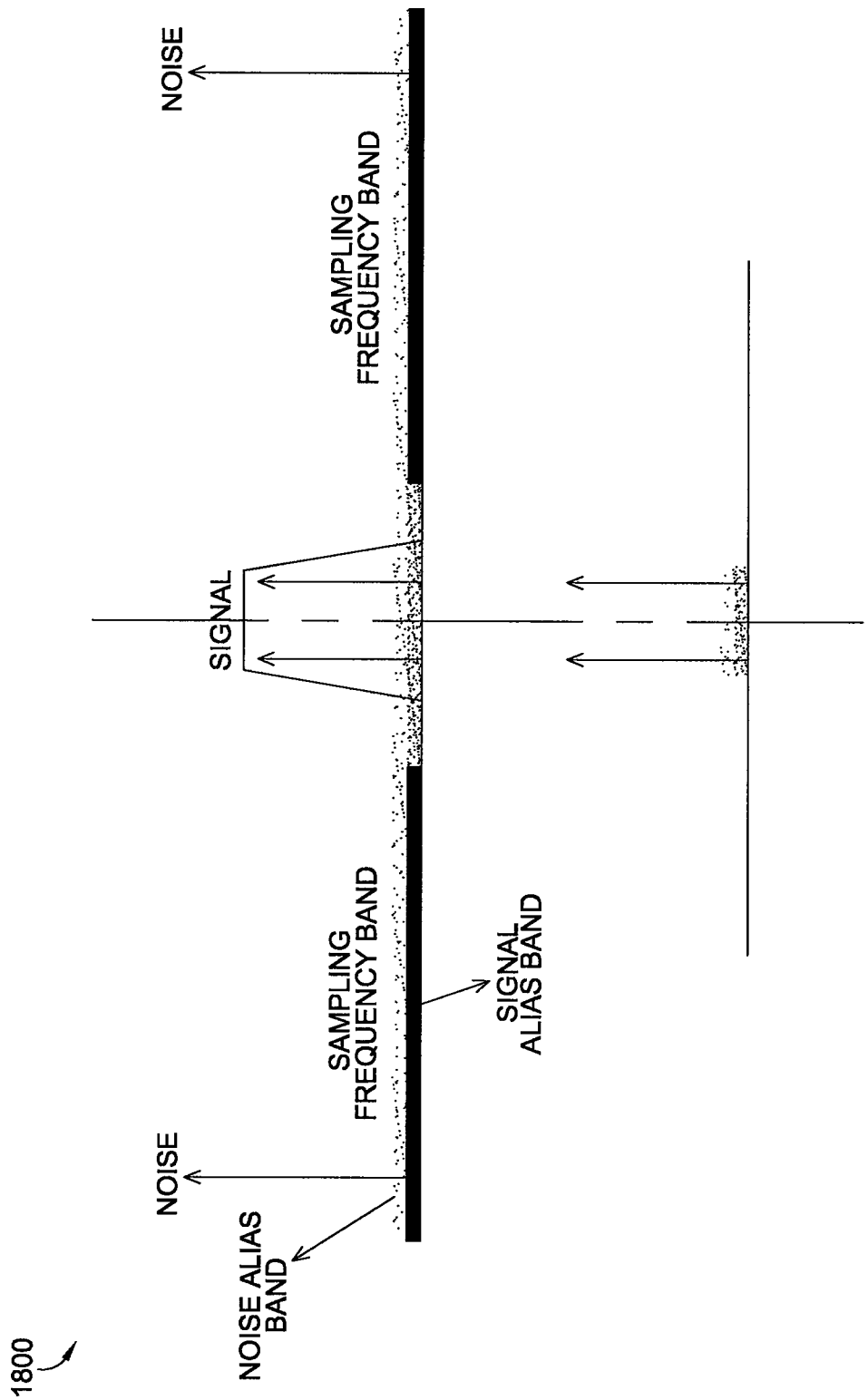
FIG. 18 is a frequency diagram showing spectrum sampling and adjustable low-pass filtering according to the present invention.
Figure 19:
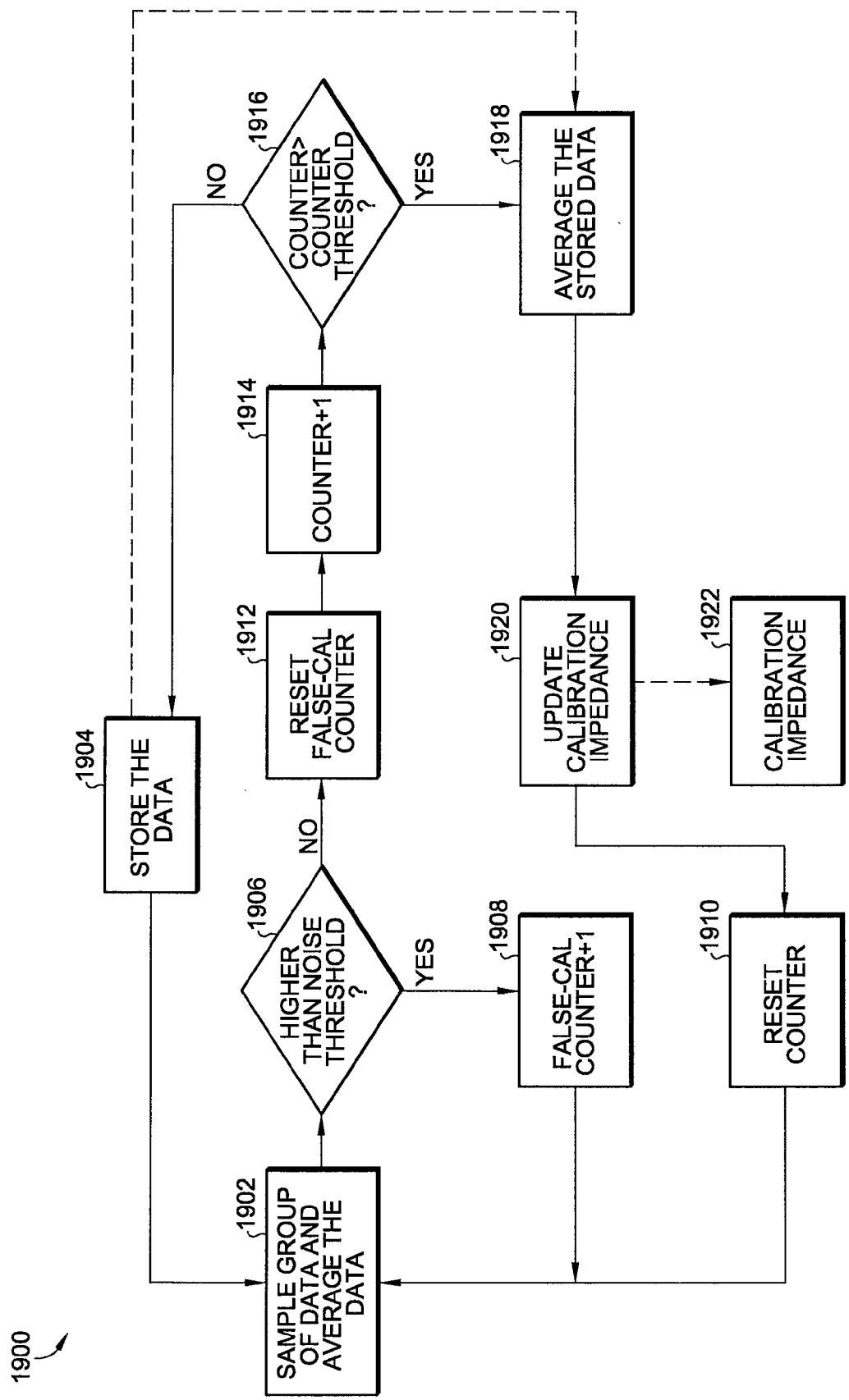
FIG. 19 is a flow chart on an adaptive calibration algorithm according to the present invention.

FIGS. 6, 7 and 15 how a block diagram and related figures of the Time-to-Digital block implementation. A noise filter block is shown in FIGS. 17 and 18, while FIGS. 19-20 show calibration and a touch detection flow-chart.

The Capacitance Sensing block modification to enable matrix touch-key or touch-screen implementation is shown in FIGS. 21-28.

A high speed delay-based capacitance measurement front-end according to the present invention is described below with respect to FIGS. 5-7. The block diagram for the measurement front-end 500 is shown in FIG. 5. Front-end 500 includes a time-to-digital block 506 for providing an output signal 504. A capacitance-to-time block 502 provides an output and control signal to block 506. Capacitance-to-time block 502 includes REF delay chain 508, driver circuits 514 and 516 respectively coupled to resistors 518 and 520, which are in turn respectively coupled to pad and reference capacitors 522 and 524, as well as buffer circuits 526 and 528. The inputs of driver circuits 514 and 516 are coupled together for receiving the S(t) Acquisition Control input signal 512. The Time-to-Digital block 506 measures the delay between the CPAD signal (sensor pad 522) and the CREF signal (capacitor 524) in a single step (each rise or fall edge of CPAD/CREF signal). The REF delay chain 508 is a programmable delay-chain for tuning purposes. The measurement delay-chain 506 measures the delay between the CPAD signal (capacitor 522) and the CREF signal (capacitor 524) in a single step (each rise or fall edge of CPAD/CREF signal). This method according to the present invention allows a higher measurement data rate in the same sensing signal frequency compared to using a delay-chain sweeping approach to measure delay between CPAD and CREF, which creates a modulation of the measured signal. This method according to the present invention also allows easier implementation of various filtering schemes without being affected by modulation created by the measurement method. The Time-to-Digital block can be realized by implementing the measurement delay chain as shown in FIGS. 13-14. Measurement delay-chains 600 and 700 are suitable for use in the measurement front-end as Time-to-Digital block according to the present invention.

An exemplary measurement delay-chain 600 is shown in FIG. 6 suitable for use in the measurement front-end according to the present invention. Measurement delay-chain 600 includes a Signal 2 input 602 coupled to a plurality of delay elements 604, which can be for example a single buffer. The outputs of delay elements 604 are coupled to a plurality of D flip-flops 606, of which a CLK pin is toggled by a Signal 1 input 608. The outputs of D flip-flops 606 are coupled to a bit-adder circuit 614. The circuit shown in FIG. 6 is one possible measurement delay chain structure that could be used in the present invention. The CREF signal from FIG. 5 is passed to Signal 1 input 608 while the CPAD signal from FIG. 5 is passed to the Signal 2 input 602. The output 610 represents the number of stages of delay between CREF and CPAD in a single edge of the CPAD/CREF signal. The measurement resolution depends on the minimum delay that can be achieved by each delay element and it is limited by the silicon process used.

Referring now to FIG. 7, an exemplary measurement delay-chain 700 is shown, suitable for use in the measurement front-end according to the present invention. Measurement delay-chain 700 includes a plurality of D-latches 710, a plurality of buffers 714, and a bit adder 702. Inverter 712 receives a first signal 708, and the output drives the plurality of serially-coupled buffers 714. The output of a last buffer, designated 714H, provides an output signal at node 716. The input of each buffer is coupled to the respective CLK input of D-latch 710. The D input of a first D-latch 710A receives the second signal at node 706. The D-latches are serially coupled together wherein the Q output of a D-latch 710 is coupled to the D input of a next D-latch 710 in the plurality of serially-coupled D-latches. The Q outputs of each D-latch 710 are also coupled to inputs of the bit adder 702, which provides a binary output at node 704. The resolution of this structure 700 shown in FIG. 7 does not depend on the minimum delay of any component, rather it depends on the delay difference between the latches 710 and the buffers 714. The CPAD signal from FIG. 5 is passed to the Signal 1 terminal 708 and the CREF signal is passed to the Signal 2 terminal 706. The binary OUT signal at node 704 represents the delay between the Signal 2 and Signal 1 edges.

The structure of the measurement delay-chain 700, according to the present invention, enables the implementation of various noise removal schemes easily since the sample acquired is the impedance value. The implementation of the measurement delay-chain 700 according to the present invention is able to measure the delay between the CPAD and CREF signals in a single cycle.

A delay accumulator utilizing a ring oscillator structure capacitance sensing front-end 800 is shown in FIG. 8. The resolution of the method according to the present invention described above with respect to FIG. 5 depends mainly on the resolution of the digital circuitry in the Time-to-Digital block 506. Resolution may be achieved by increasing the resistance of the driver, but doing so will increase the effect of external noise. The description of FIG. 8, as well as the description of FIGS. 9-14, concentrates on resolution improvement in the analog domain without increasing driver resistance.

The delay accumulator with ring oscillator structure 800 shown in FIG. 8 requires two signals CREF and CPAD. The delay between these two signals is accumulated in Capacitance-to-Time block 862 before they are passed to the Time-to-Digital block 802. Starting in the middle of block 862, buffer 828 receives a stimulus input signal 826, which is coupled to switches 830 and 834 under control of signal A. The output of switch 830 is coupled to a driver circuit including P-channel transistor 838, N-channel transistor 842, and resistor 840. The output of this circuit drives CREF capacitor 844. The CREF signal is buffered by buffer 818, which provides the Con-Sense signal 816, which is in turn received by delay chain 814. The output of delay chain 814 is coupled through switch 812 under control of signal B. The other end of switch 812 receives the Count signal 832. The output of delay chain 814 is also coupled to the input of D-type flip-flop 806 through switch 810 under control of the C signal. A resistor 808 is also coupled from the input of D-type flip-flop 806 to ground. The output of D-type flip-flop 806 is coupled to a Signal 1 input of Time-to-Digital block 802, which provides an output signal at node 804. Similarly, the output of switch 834 is coupled to a driver circuit including P-channel transistor 846, N-channel transistor 850, and resistor 848. The output of this circuit drives CPAD capacitor 852 associated with pad 854. The CPAD signal is buffered by buffer 856, which is in turn received by delay chain 836. The output of delay chain 836 is coupled through switch 824 under control of signal B. The other end of switch 812 is coupled back to the gates of transistors 846 and 850. The output of delay chain 836 is also coupled to the input of D-type flip-flop 820 through switch 860 under control of the C signal. A resistor 822 is also coupled from the input of D-type flip-flop 820 to ground. The output of D-type flip-flop 820 is coupled to the Signal 2 input of Time-to-Digital block 802, which provides the output signal at node 804.

In operation, controller 858 first issues a system reset. Switches 830 and 834 under control of signal A are then closed while switches 812 and 824 under control of signal B and switches 810 and 860 under control of signal C are open. The controller 858 then issues the stimulus signal 826 (falling edge signal). When the first rising edge reaches the Con-Sense node 816, the controller 858 then opens the switches associated with control signal A and control signal B, which activates the ring oscillator function. Each iteration increases the delay time based on the capacitance difference between CPAD and CREF. The controller 858 counts the iterations by sensing the number of rising edges at the count node 832. Once the counter reaches N−1 (wherein N is the desired number of iterations), the switches associated with control signal C are closed. The accumulated delay signal is then fed to the Time-to-Digital block 802 and an output signal is provided at node 804. The method described above allows a stronger driver, which is less prone to noise, while at the same time the same or higher sensitivity may be achieved. The sensitivity of the circuit shown in FIG. 8 is adjustable in software by changing the value of iteration and can reach a higher sensitivity compared to capacitive sensor described in FIG. 5.

Another alternative of the Capacitance-to-Time 960 and Time-to-Digital 958 blocks is a Charge-accumulator delay-based capacitive sensing front-end 900 as is shown in FIG. 9. The circuit 900 shown in FIG. 9 is an alternative embodiment for time-to-digital conversion according to the present invention. Delay measured between CREF and CPAD for each cycle is accumulated in a sensing capacitor in the form of charge before the total charge accumulated is digitized. The circuit and method of FIG. 9 requires two sensing signals, CREF and CPAD.

Starting in the middle of block 960, a signal at node 936 is coupled to a driver circuit including P-channel transistor 928, N-channel transistor 930, and resistor 932. The output of the driver circuit is coupled to the CREF capacitor 934 as well as the input of buffer 926. The output of buffer 926 drives the input of delay chain 922, which is under the control of delay signal 924. The output of delay chain 922 is coupled to one input of XOR gate 920. Similarly, the signal at node 936 is coupled to a driver circuit including P-channel transistor 938, N-channel transistor 942, and resistor 940. The output of the driver circuit is coupled to the CPAD capacitor 944 as well as the input of buffer 948. The output of buffer 948 is coupled to the other input of NOR gate 920. The output of NOR gate 920 controls control switch 918. One side of switch 918 receives the SB current source 916. The other side of switch 918 is coupled to switch 914, which is controlled by the A signal from controller 956, as well as N-channel transistor 950, which is controlled by the Reset signal 954 from controller 956, as well as coupled to the CSense capacitor 952. The other side of switch 914 is coupled to the SA current source 912, and the positive input of comparator 908. The negative input of comparator 908 receives the VREF reference voltage 910. The output of comparator 908 is coupled to an input of counter 904. Counter 904 is controlled by control signal 906 and provides an output signal at node 902.

In operation, the controller 956 issues a system reset. The controller 956 provides a falling edge signal at node 936 and the delay between CPAD and CREF is captured by XOR gate 920. The output of the XOR gate 920 controls switch 918, which connects current source SB 916 with external Sensing Capacitor 952. Capacitor 952 is charged proportional to the delay. The controller 956 may perform this process any number of times up to a predetermined number of cycles according to sensitivity needs determined by a particular application. After the charging process is completed, controller 956 discharges the Sensing Capacitor 952 with current source SA and starts the counter 904. Once the level of voltage at the positive input of comparator 908 reaches the threshold VREF voltage, the comparator 908 provides an output signal to stop the counter 904. The counter result is the output at node 902.

Figure 10:
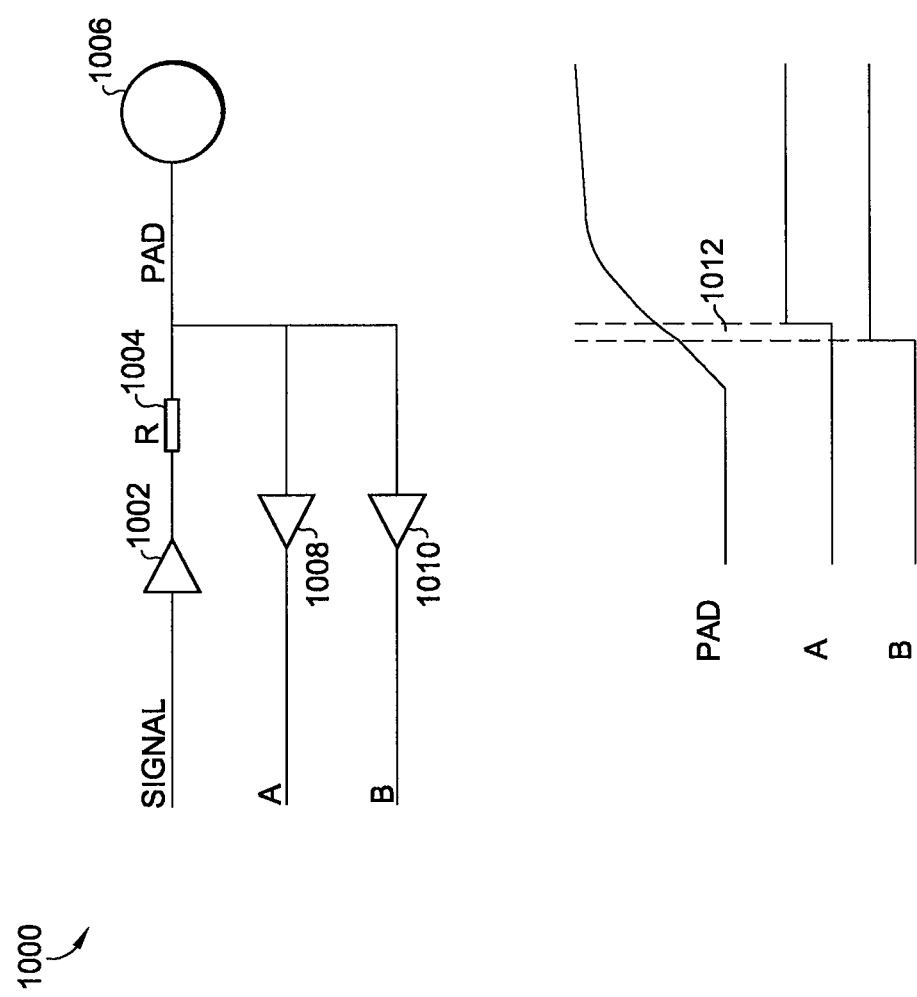
FIG. 10 is a schematic diagram of a circuit and a corresponding timing diagram associated with a rise-fall time accumulation capacitive sensor front-end according to the present invention.
Figure 11:
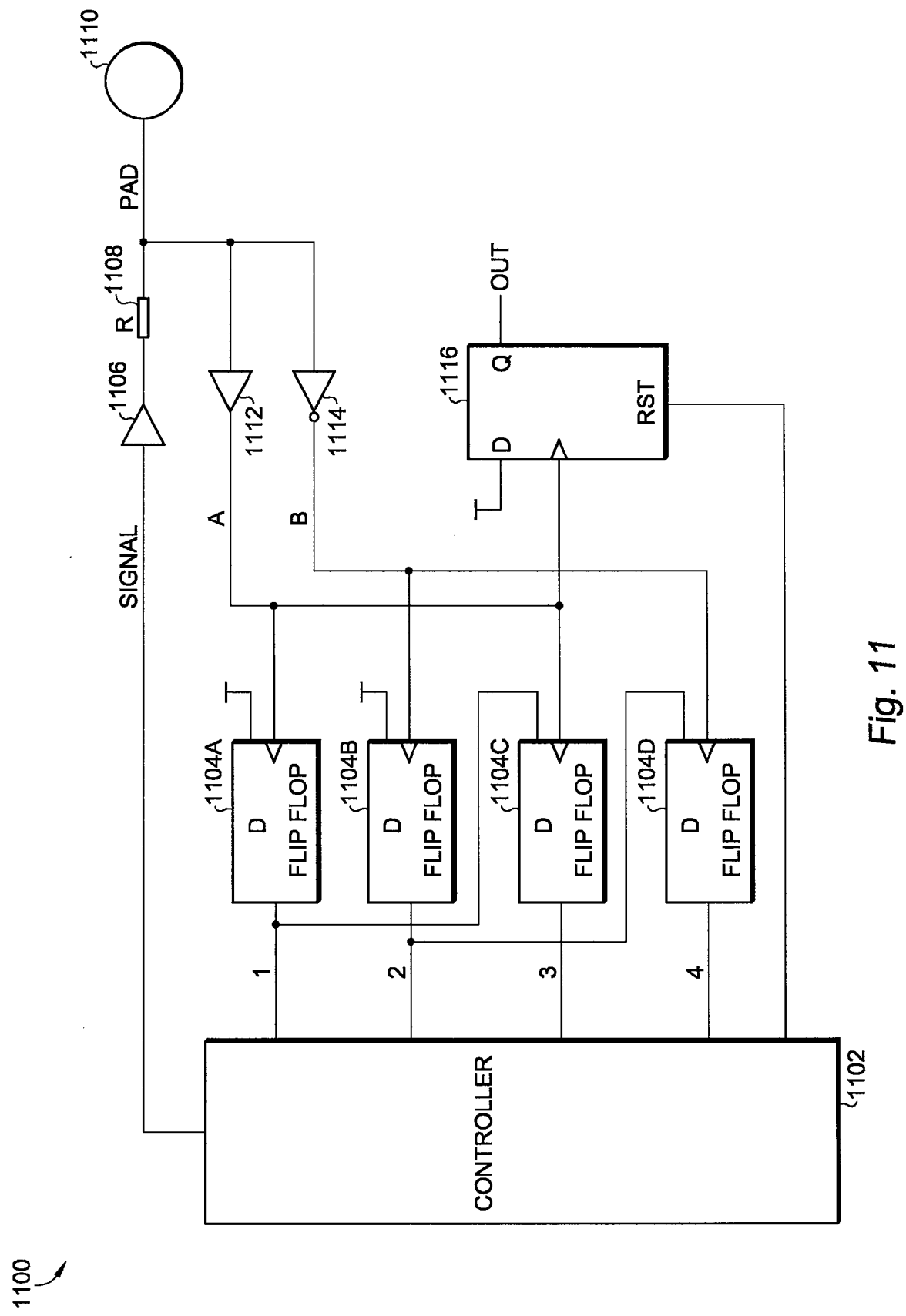
FIG. 11 is a schematic diagram of an accumulator block associated with the circuit of FIG. 10, according to the present invention.

Referring now generally to FIGS. 10-14, a rise-fall time accumulation capacitive sensor front-end is described according to the present invention; it is an improved version of the delay accumulator shown in FIG. 8. Instead of utilizing an uncontrolled ring-oscillator structure, it uses controlled iteration as is shown in FIG. 11. A reliable capacitive sensor front-end is required for touch screen, wheel, and slider applications. The circuit and method described below requires only a single sensing signal. The capacitance-to-time conversion is done by measuring the rise/fall time of the sensing signal, which is proportional to the capacitance.

The basic circuit and method according to the present invention is shown in FIG. 10. Circuit 1000 includes a buffer 1002 for receiving an input signal, coupled to a resistor, which is in turn coupled to the pad 1006. Two buffers 1008 and 1010 with different thresholds (for example 0.4×VCC, and 0.6× VCC) are used to capture the PAD signal rise time. Buffer 1008 provides an A output signal and buffer 1010 provides a B output signal. The delay between the B and A output signals represents the rise time of the PAD signal which is proportional to the capacitance of sensor PAD. This is clearly demonstrated in the corresponding timing diagram shown in FIG. 10 wherein the PAD, A, and B signals are shown. Note the relationship between the delay portion 1012 between the B and A output signals and the rise time of the PAD signal.

Referring now to FIG. 11, a block diagram of a rise/fall accumulator block 1100 according to the present invention is shown. The accumulator block includes controller 1102 coupled to a plurality of D-type flip-flops 1104. An output of controller 1102 provides an input signal to buffer 1106, which drives pad 1110 through resistor 1108. A buffer 1112 senses the pad voltage and provides the A signal to the clock input of D-type flip-flops 1104A, 1104B, and 1104C. Inverter 1114 provides the B signal to the clock input of D-type flip-flop 1104D. An additional D-type flip-flop 1116 is coupled to controller 1102 on the RST node and provides an output signal OUT at the Q output thereof. To increase the effect of capacitance change to the rise/fall time, the circuit 1100 above provides multiple rise/fall time accumulation. The timing diagram 1200 for accomplishing this is shown in FIG. 12.

Figure 12:
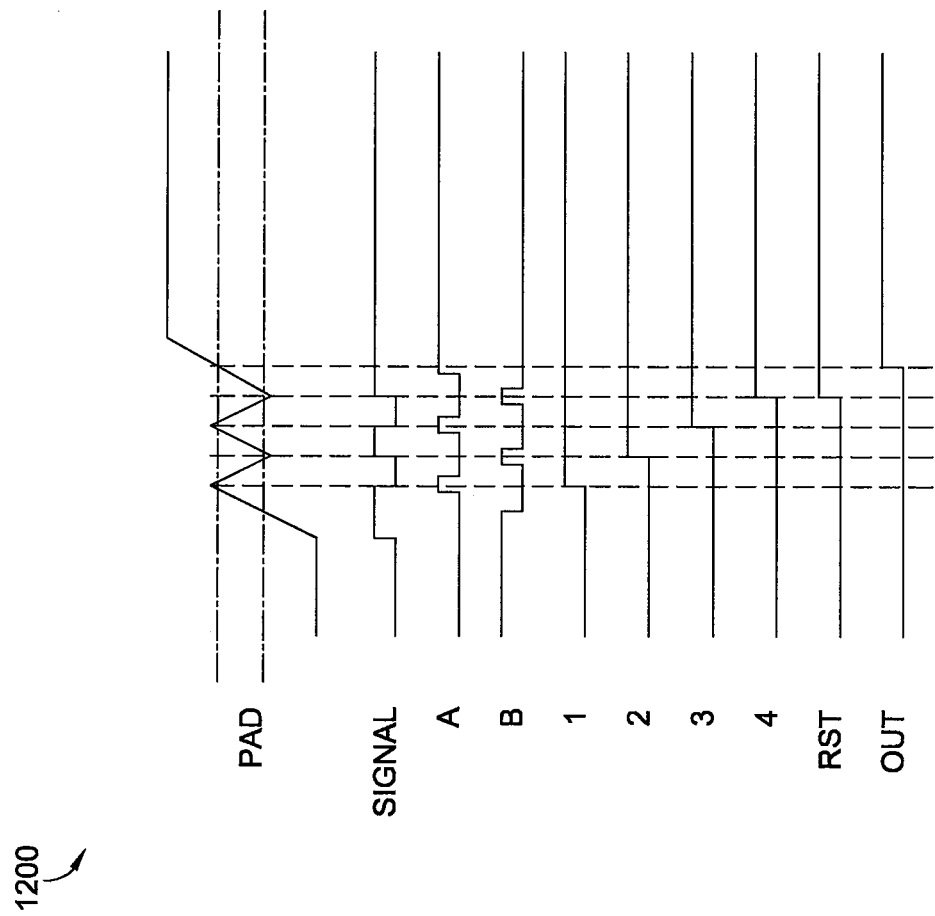
FIG. 12 is a timing diagram associated with the accumulator block of FIG. 11, according to the present invention.

Referring now to the timing diagram 1200 of FIG. 12, the total rise/fall time accumulation can be measured from the first falling edge of signal B to the rising edge of the OUT signal. The total rise-time accumulation is described below, where the effect of the capacitance is multiplied by a factor of five, assuming all other variables are kept constant. This allows an increase in capacitance measurement sensitivity using the same resolution of the Time-to-Digital block. The multiplier factor can be changed by changing the number of rise/fall time which are accumulated, which can be realized by adding/reducing the number of active D flip-flops in the system. Using four flip-flops, there are five rise/fall times that are accumulated and the capacitance to time relationship is defined below (assuming 0.4×VCC and 0.6×VCC as the respective thresholds of buffers 1112 and 1114):

$$t_{rise\text{-}fall\text{-}accumulated} = 5 \times RC \ln(9/4)$$

The block diagram of a time offset block 1300 is shown in FIG. 13, according to the present invention. The circuit 1300 is similar to the accumulator 1100 shown in FIG. 11, and includes a controller 1302 coupled to a plurality of D-type flip-flops 1304. An output of controller 1302 provides an input signal to a programmable delay-chain 1306, which drives the input of buffer 1308 and inverter 1310. Buffer 1308 provides the A signal to the clock input of D-type flip-flops 1304A, 1304B, and 1304C. Inverter 1310 provides the B signal to the clock input of D-type flip-flop 1304D. An additional D-type flip-flop 1312 is coupled to controller 1102 on the RST node and provides an output signal OUT at the Q output thereof. The time offset circuit 1300 is a block that gives a fixed time reference to be compared during the accumulated rise-fall time measurement. This avoids the need for a long dynamic range measurement delay chain. The programmable delay chain is set to a number that provides the OUT signal of the time offset block 1300 to arrive just slightly earlier than OUT signal of the accumulator block 1100 described with respect to FIG. 11. The time offset block 1100 provides the same number of iterations as provided by the rise/fall time accumulator 1300. Hence, a long programmable delay-chain is not required. The time offset block is triggered by the first falling edge of the B signal from the accumulator block 1100.

The overall block diagram of the rise/fall time accumulator 1400 is shown in FIG. 14 including the time offset circuit 1402, which receives the B signal from the rise/fall time accumulator circuit 1404, which is in turn coupled to pad 1406. The outputs from the time offset circuit 1402 and the rise/fall time accumulator circuit 1404 are received by the Time-to-Digital block 1408 for providing an impedance reading output signal 1410. The output of the Time-to-Digital block represents the capacitance of PAD 1406.

The advantage of a rise/fall time accumulator circuit according to the present invention is that it provides reliable and adjustable sensitivity to a capacitive front-end sensor system. A higher capacitive load can be sensed by reducing the value of the driver resistor and increasing the number of repetitions to achieve the same amount of sensitivity. The accumulation of rise/fall times gives an averaging effect to the measurement. In addition, disturbance matrix sensing (described below) can be applied with high sensitivity. Hence, a multi-touch touch-key matrix and touch screen can be realized.

A circuit 1500 is shown in FIG. 15 for fractional-bit insertion to increase the resolution of a measurement delay-chain shown in FIG. 6. A delay-chain typically includes a string of inverters or buffers. The effect is to create a measured delay from the input to the output of the delay-chain. In FIGS. 5-7 and corresponding text, a modification of delay chain structure to measure delay between two signals is shown and described. In that system, the resolution of the measurement depends on the delay resolution of each cell of buffers or inverters in the string. Resolution can be increased by reducing the delay of each cell, but it is constrained by process and lay-out matching of the delay chain string. Increasing resolution by reducing delay time of the cell means a longer string is needed to maintain the range of measurement. For example, a string of 100 cells with a delay of 500 ps will be able to measure delay between 0 to 50 ns with a resolution of 500 ps. If the cell delay time is reduced to 250 ps (to increase resolution), a string of 200 cells is required to maintain the 0 to 50 ns range. In the fractional-bit insertion circuit 1500, according to the present invention, resolution of the delay chain is increased without reducing delay time of each cell. Thus, there is no need to push the cell size smaller (to reduce delay time), hence linearity of the string is easier to maintain during the lay-out. By using the same number of cells and the same delay time for each cell, the measurement range is not affected.

Referring now to FIG. 15, a fractional-bit insertion circuit 1500 is shown having four switched delay cells 1502A-D, followed by a delay string of cells 1504A-G. Any number of delay cells 1504 can be used in the delay string as required for a particular application. The delay string is coupled to a plurality of D-type flip-flops 1506 corresponding to each of the delay cells 1504. The plurality of D-type flip-flops 1506 is coupled to a decoder 1508 for providing an output signal. A first signal is coupled to the inputs of the four switched delay cells 1502A-D, and a second signal is coupled to the clock inputs of the plurality of D-type flip-flops 1506. Although only one string of a delay chain is used including a plurality of serially connected delay stages 1504A-G, four different switched delay cells 1502A-D are used in the first stage which respectively have 1, 1.25, 1.50, and 1.75 delay units. Signal 1 arrives earlier than signal 2, which is the delay to be measured. Signal 1 and signal 2 are passed to the delay chain four times in this illustration (resolution will be increased by four times). For the first time, switch A is closed and signal 1 passes through the first stage delay chain with 1 unit delay time. A reading is then taken. For the second time, switch D is closed and signal 1 passes through the first delay chain with 1.75 unit delay time. A reading is again taken. For the third and fourth times the process is repeated with switch C and B closed respectively. At the end of this process, four readings are available to be processed. The values are then averaged to get the final data.

The delay of a normal delay chain with 1000 ps resolution (1 unit) and 256 length (8 bits) is shown in Table I. As an illustration, a delay of 180.1, 180.3, 180.6, 180.9 and 181.4 unit delays is to be measured. Using a normal delay chain, the results of the sampling are shown below:

TABLE I

| Delay (unit) | Measurement (unit) |
|---|---|
| 180.1 | 180 |
| 180.3 | 180 |
| 180.6 | 180 |
| 180.9 | 180 |
| 181.4 | 181 |

A similar Table II is shown below to illustrate the fractional-bit insertion technique according to the present invention:

TABLE II

| | 9 | 8 | 7 | 6 | 5 | 4 | 3 | 2 | 1 | 0 | Unit | Delay being measured |
|---|---|---|---|---|---|---|---|---|---|---|---|---|
| First  | 1 | 0 | 1 | 1 | 0 | 1 | 0 | 0 | 0 | 0 | 180.00 | 180.1 |
| Second | 1 | 0 | 1 | 1 | 0 | 0 | 1 | 1 | 1 | 1 | 179.75 | |
| Third  | 1 | 0 | 1 | 1 | 0 | 0 | 1 | 1 | 1 | 0 | 179.50 | |
| Fourth | 1 | 0 | 1 | 1 | 0 | 0 | 1 | 1 | 0 | 1 | 179.25 | |
| Result | 1 | 0 | 1 | 1 | 0 | 0 | 1 | 1 | 1 | 0 | 179.50 | |

The delay chain measurement result is presented in bits [9 . . . 2], while bits [1 . . . 0] are fraction-bits where the value is assigned depending upon the first cell used. For example, in the "1 unit" cell, bit[1 . . . 0] is set to be 00. For the 1.75, 1.50, and 1.25 unit cells bit [1.0] is set to be 11, 10, and 01, respectively. The delay being measured is 180.1 units of delay. In the first round (switch A is closed) the flip-flop delay-chain measures 180 units of delay. Fractional-bits are assigned to be 00. In the second round switch D is closed. The delay being measured, 180.1 units, is below 180.75 and above 179.75, hence the measurement result is 179, and fractional-bits are set to 11. In the third round (switch C is closed) the measurement result is 179, and the fractional-bits are set to 10. In the fourth round (switch B is closed) the measurement result is 179, and fractional-bits are set to 01. The four 10-bit data are then summed up and the result is right shifted two bits to get 179+fraction-bits of 10, which is equal to 179.50 units of delay.

Another fractional-bit insertion illustration is shown below with respect to Table III:

TABLE III

| | 9 | 8 | 7 | 6 | 5 | 4 | 3 | 2 | 1 | 0 | Unit | Delay being measured |
|---|---|---|---|---|---|---|---|---|---|---|---|---|
| First  | 1 | 0 | 1 | 1 | 0 | 1 | 0 | 0 | 0 | 0 | 180.00 | 180.3 |
| Second | 1 | 0 | 1 | 1 | 0 | 0 | 1 | 1 | 1 | 1 | 179.75 | |
| Third  | 1 | 0 | 1 | 1 | 0 | 0 | 1 | 1 | 1 | 0 | 179.50 | |
| Fourth | 1 | 0 | 1 | 1 | 0 | 1 | 0 | 0 | 0 | 1 | 180.25 | |
| Result | 1 | 0 | 1 | 1 | 0 | 0 | 1 | 1 | 1 | 1 | 179.75 | |

For delay of 180.3 units, the same process described above gives 179.75 units as the result.

Yet another fractional-bit insertion illustration is shown below with respect to Table IV. Below is the summary of the measurement using fractional-bit insertion. It can be seen that the measurement result is always less by 0.5 unit from the actual value. Hence 0.5 delay units can be added to get the final result which is four times higher in resolution (additional two bits inserted).

TABLE IV

| Delay (unit) | Measurement (bit) | Measurement (unit) | Measurement + 0.5 (unit) |
| --- | --- | --- | --- |
| 180.1 | 10110011.10 | 179.50 | 180.00 |
| 180.3 | 10110011.11 | 179.75 | 180.25 |
| 180.6 | 10110100.00 | 180.00 | 180.50 |
| 180.9 | 10110100.01 | 180.25 | 180.75 |
| 181.4 | 10110100.11 | 180.75 | 181.25 |

Figure 16:
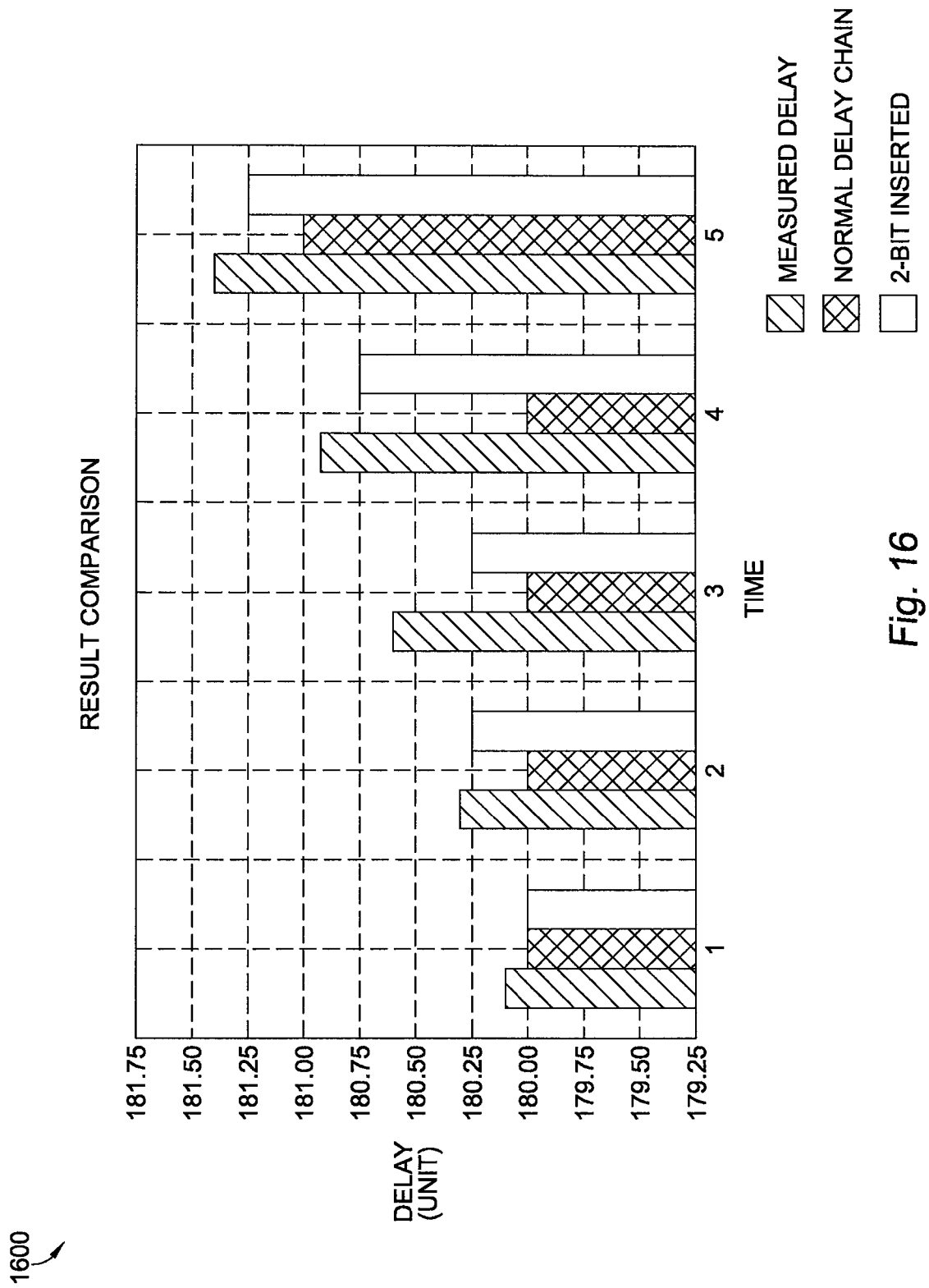
FIG. 16 is chart comparing measured delay, delay of a normal delay chain, and the delay of a fractional-bit insertion chain according to the present invention.

The result comparison graph 1600 is shown in FIG. 16, comparing the actual measured delay with the measured delay from a normal delay chain, and the delay using the fractional-bit insertion technique of the present invention, with two bits inserted.

Noise removal and data processing in a delay-based capacitive sensing system according to the invention is described below with respect to FIGS. 17-20 (and previously described in overview fashion in FIGS. 1-4). A capacitive touch sensor system is always prone to noise, whether it is periodic, random or shot noise. In a system, most of the periodic noise is at higher frequency, hence it is impossible to do only low pass filtering and ignore the aliasing effect of the noise. Some edges of rarely switching I/O may create other types of noise that are rare but have a significant magnitude of noise, which are generally called shot noise. The natural touch signal from a human finger is mainly a low-frequency signal. All types of noise need to be filtered out to obtain reliable sensing.

The noise filtering according to the present invention uses spread spectrum sampling in order to spread the power of the periodic noise, which is sampled together with the natural touch signal. This method minimizes the power of noise aliasing in the low-frequency region (which is the region of the natural touch signal). A low pass filter (averaging) is used to filter out the high-frequency noise (including the noise aliases). The low-pass filter is equipped with a median filter, which will filter out the shot noise, before averaging is performed. A median filter works by populating a group of samples and then sorting the samples. The number of samples in the group is adjustable. The lowest and highest value in the group are discarded and the rest of the samples are averaged to get a single data output.

A block diagram of a noise filtering circuit 1700, previously shown in FIG. 3, is reintroduced as FIG. 17. The noise filter block 1702 includes two main parts, the spread spectrum signal generator 1704 and the digital filter 1706 (Median and Averaging). The spread spectrum signal generator 1704 gives an acquisition signal command to the capacitive sensor 1708 (coupled to pad 1710) to begin sampling data. This is to minimize the power of noise aliases that appear in the low-frequency region. The data from block 1708 is then transferred to the digital filter block 1706 where the shot noise and random noise are filtered out at the output.

Referring now to FIG. 18, the spread spectrum sampling and adjustable low-pass filtering 1800 is explained in further detail. The spread spectrum sampling frequency has an effect of whitening for signals that have a higher frequency than the lower limit of the sampling band. These signals are considered as noise. The power of the noise is also spread in the whole of the noise alias band. Since most of the noise sources are transferring the energy as an electric field, naturally noise should have a relatively high frequency to have an effect in sensor capacitance. Low frequency signals (useful signal, finger touch) are still recovered successfully after low pass filtering in this scenario, as shown in FIG. 18. Since all the filtering is done in the digital domain, when the noise level increases, the user may easily change the cut-off frequency of the low-pass filter to reduce noise power in output of low pass filter.

An adaptive calibration algorithm according to the present invention is described below with respect to FIG. 19. Calibration is very important for the system as it gives the reference for every impedance measurement, determines whether it is to decide a touch/no-touch condition and defines the impedance change. In the calibration algorithm of FIG. 19, the calibration cycle is done in a period of time. At the event of calibration, a group of data is acquired, averaged and then stored. After N cycles of calibration, the data stored in the memory is once again averaged and the result is taken as a calibrated impedance. A single calibration impedance is produced by collecting data (which is already filtered by the front-end filter) from a period of time and averaging them. Hence the effect of noise is minimized further. In each cycle the data is compared with the previous calibrated impedance and noise threshold (Environment Variance). If it is higher, the data is discarded, and a false-cal counter is triggered. If the false-cal counter reaches a predetermined threshold, the device will flag to the host (Calibration Stuck). The above calibration algorithm is set forth below in the flow chart of FIG. 19 showing the sampled and averaged data block 1902, storage block 1904, noise threshold decision block 1906, increment false-cal block 1908, reset counter block 1910, reset false-cal counter block 1912, increment counter block 1914, counter greater than a counter threshold decision block 1916, average stored data block 1918, update calibration impedance block 1920, and calibration impedance output block 1922.

Figure 20A:
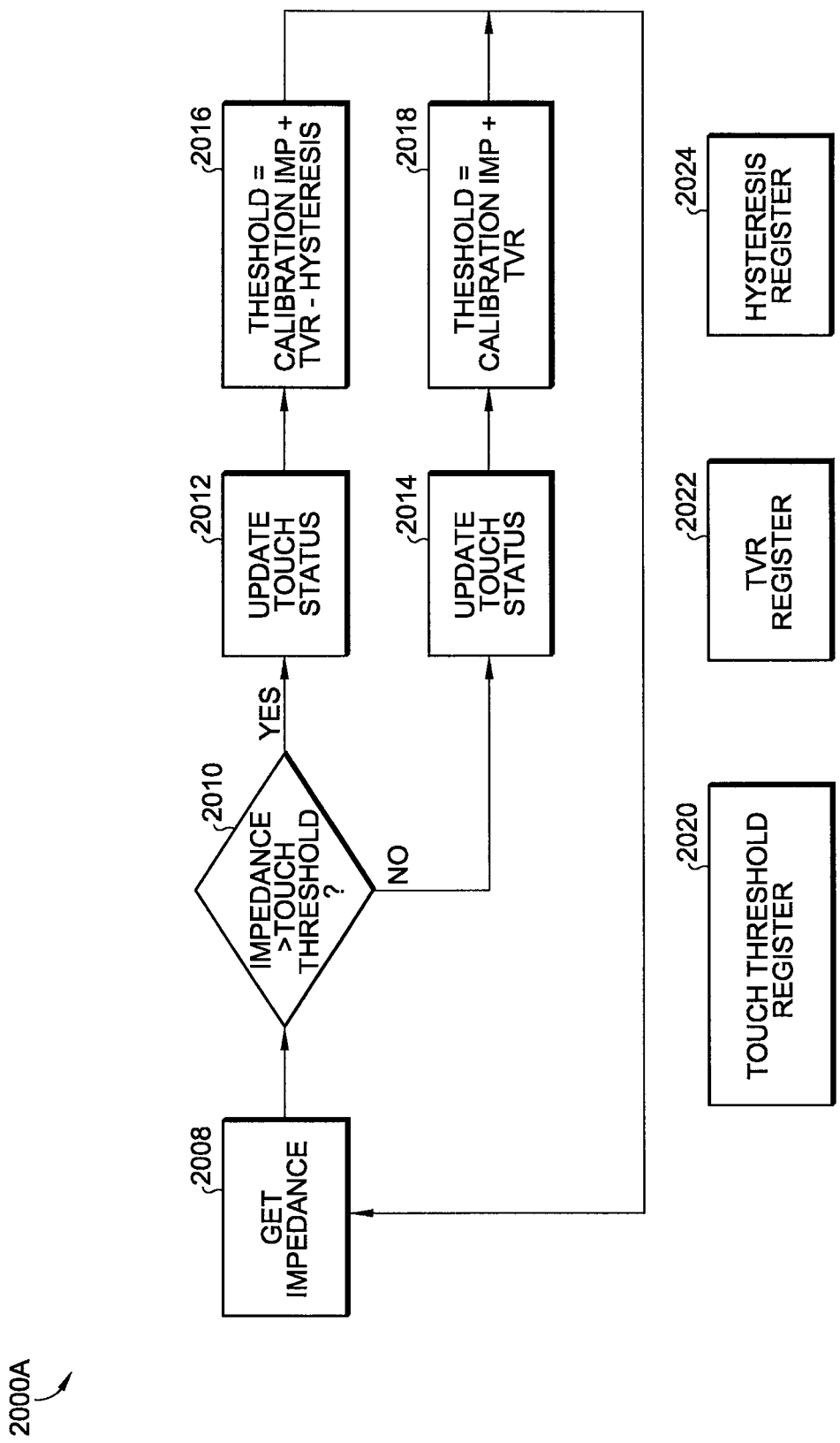
FIG. 20A is a block diagram of a touch detection portion of the capacitive touch sensor system according to the present invention.

Touch detection according to the present invention is explained below with reference to FIG. 20A. TVR ("Touch Variance") and hysteresis is set by the user. When the there is no touch status, the threshold for touch detection is set to be the same value as TVR. If a touch is detected, the threshold value is changed to TVR-hysteresis. This is done to prevent instability in touch detection. The touch detection flow chart 2000A is shown in FIG. 20A and includes the get impedance block 2008, impedance greater than a touch threshold decision block 2010, update touch status blocks 2012 and 2014, and threshold blocks 2016. In block 2016 the threshold is set to the calibration impedance plus TVR minus hysteresis, and in block 2018, the threshold is set to the calibration impedance plus TVR. In FIG. 20A, the touch threshold register 2020, the TVR register 2022, and the hysteresis register 2024 are all shown.

Figure 20B:
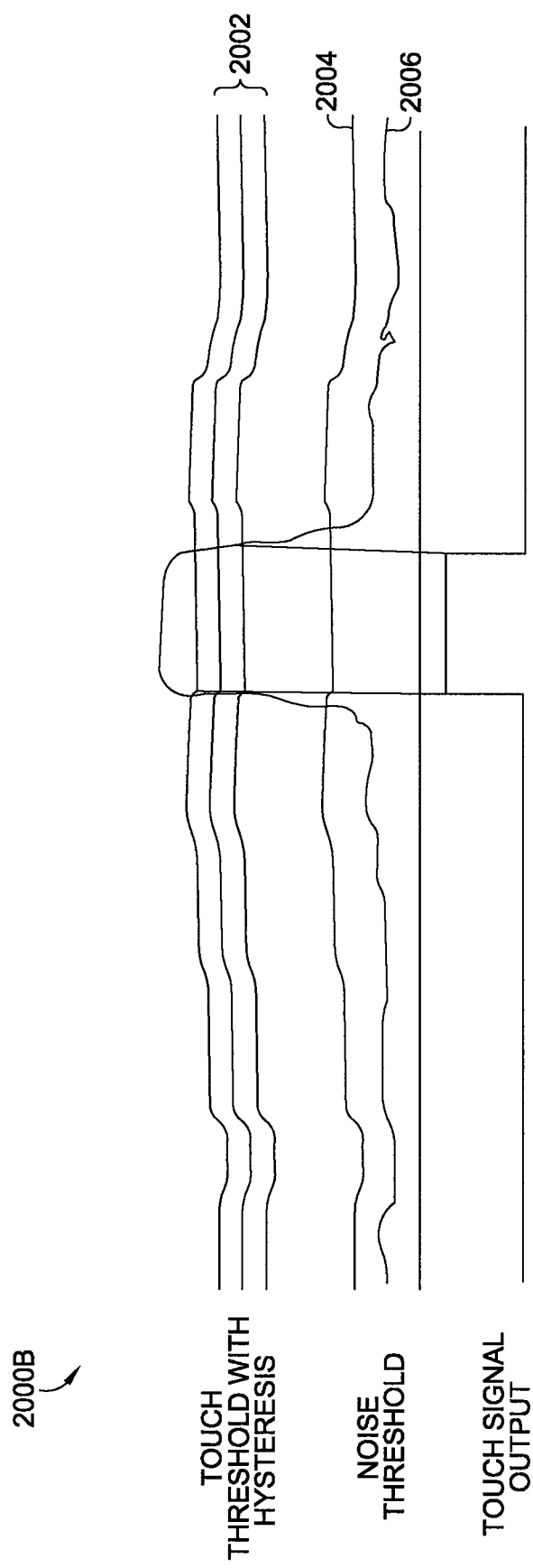
FIG. 20B is a timing diagram associated with the block diagram of FIG. 20A.

The touch detection mechanism according to the present invention is illustrated with reference to the timing diagram 2000B shown in FIG. 20B. The touch threshold is equipped with hysteresis, which is done to avoid an unstable touch/no-touch condition. In the no-touch condition, the touch threshold level is higher compared to the touch condition. The noise threshold and the touch detection threshold is updated during calibration. FIG. 20B shows the touch threshold with hysteresis 2002, the noise threshold 2004, and the touch signal output 2006.

If desired, a strength filter feature can be used according to the present invention. The user can define a group of keys that are close to each other. When a key or several keys in the group are classified as "touched" in the group, the device looks for the strongest change in impedance in the group, confirm the "touched" status of the 1/2/3 . . . strongest keys and cancels the "touched" status of the other keys. This feature allows users to place a group of sensors close to each other but does not expect a multi-key touch.

With respect to the noise removal and data processing shown generally in FIGS. 17-20, an under-sampled noise spread spectrum sampling method is shown, which spreads the power of the noise and is followed by a digital low-pass filter, which recovers low frequency signals (the touch signal) and a small portion of the noise alias band. Since the low-pass filter is in the digital domain, it easily can be adjusted to handle different levels of noise power. This method according to the present invention suppresses noise as well as reduces EMI. An adaptive calibration algorithm, which is able to adapt to gradual changes in the operating environment, is shown to differentiate touch or no-touch conditions. Finally, a strength filter is described to allow only 1/2/3/ . . . valid touches in closely positioned sensors.

Figures 21, 22:
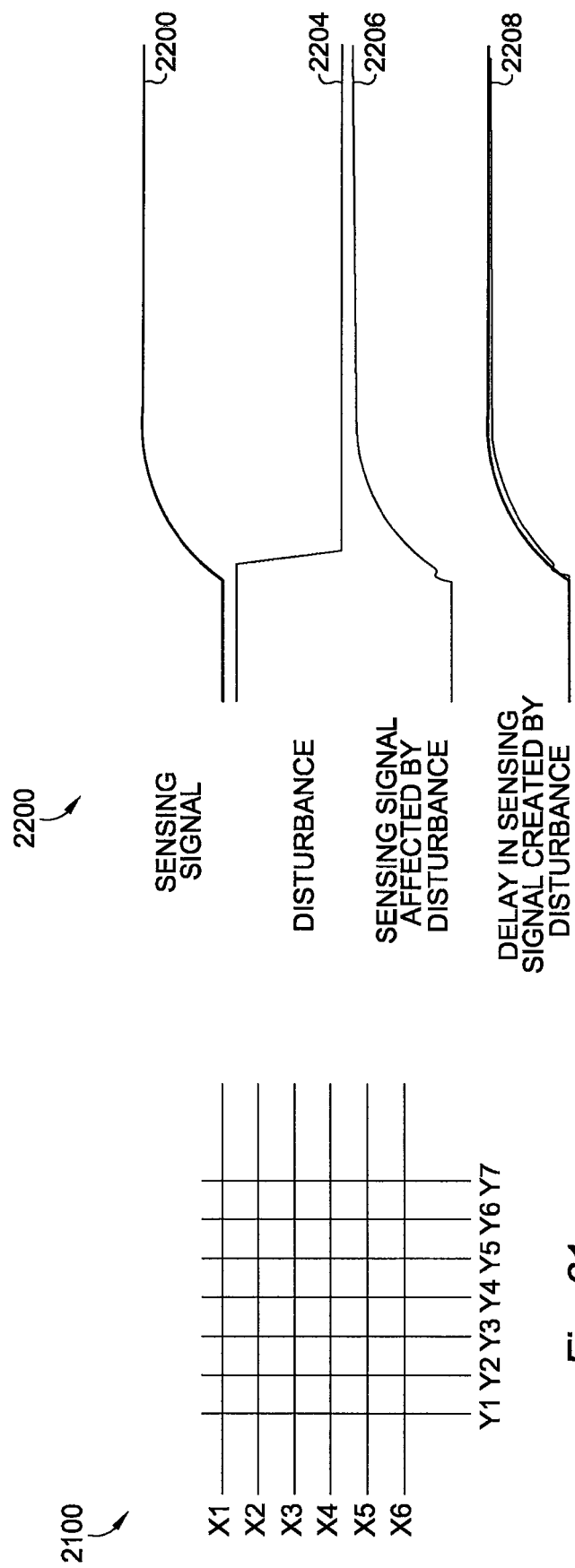
FIG. 21 is a diagram of a sense-only capacitive sensor system according to the prior art.
FIG. 22 is a timing diagram of sense and disturbance signals for applying a matrix of X-axis lines and Y-axis lines according to the present invention.

In a matrix touch-pad/screen location sensor, a matrix configuration of a delay-based capacitive sensor according to the present invention is now described generally with reference to FIGS. 21-28. Sense-only capacitive sensors can only give a single valid location in projected touch screen applications. Force-Sense type capacitive sensors are required to provide valid multi-touch locations. The basic structure of a prior art sense-only capacitive sensor 2100 is shown in FIG. 21, including X-axis lines X1-X6, and perpendicular Y-axis lines Y1-Y7. In a keys-matrix application, if two buttons are pressed, the sensor shown in FIG. 21 can only give two locations in the Y-axis and two locations in the X-axis. No information is given regarding the combination between those locations, hence there are four possible coordinates.

A disturbance-sensing modification on the capacitance-to-time converter block is described below. In a matrix configuration, a sensing signal can be applied to the X-axis lines and a disturbance signal can be applied to the Y-axis lines. The disturbance signal creates additional delay to the sensing signal through cross-capacitance between the X-pad and the Y-pad. If a location is touched, the cross-capacitance is reduced. This cross-capacitance can be measured by sweeping the data along the X-axis lines. Referring now to FIG. 22, a timing diagram 2200 shows the various waveforms for the sensing signal 2202, the disturbance signal 2204, the sensing signal affected by the disturbance 2206, and the delay in the sensing signal created by the disturbance 2208.

The disturbance-sensing method according to the present invention is further described with reference to FIG. 23. A touch pad or touch screen 2300 includes three electrode pairs coupled to an X-axis line and respectively coupled to three Y-axis lines Y1, Y2, and Y3. The corresponding waveforms associated with the X-axis line and the three Y-axis lines Y1, Y2, and Y3 are also shown. According to the present invention, measurement sweeping is done on one X-axis line. Y1 disturbs cycle 1, Y2 disturbs cycle 2, Y3 disturbs cycle 3, and YN disturbs cycle N. When a finger presents on one of the electrode pairs shown in FIG. 23, it increases the X-line capacitance and at the same time reduces the cross-capacitance in a particular pair.

Figures 23, 24:
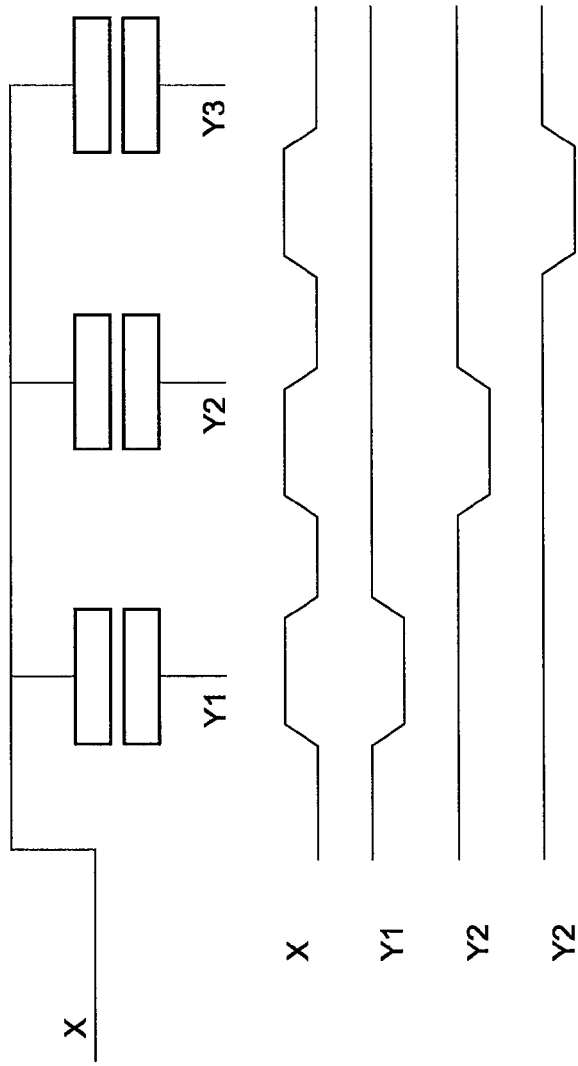
FIG. 23 is a timing diagram and touch pad portion illustrating disturbance-sensing according to the present invention.
FIG. 24 is a table illustrating disturbance sensing according to the present invention.

The disturbance-sensing method of the present invention according to the present invention is further described with respect to the table 2400 shown in FIG. 24. When there is no finger touch, capacitance measured by X with Y1, Y2, or Y3, the disturbance should be relatively similar. This is shown as the capacitance measured by Y1, Y2, and Y3 are all five units of capacitance. In the presence of finger touch in the X-Y2 electrode, the capacitance measurement at the X-line overall increases, except at the combination of the X-Y2 disturbance. The effect of the Y2 disturbance is now blocked by the finger, hence this gives much less effect to the X capacitance. This is illustrated in table 2400, wherein the capacitance measurement at the X-Y2 combination increases less than the other two. The example in FIG. 24 shows the measured X-Y1 capacitance is 30 units, the measured X-Y2 capacitance is 18 units, and the measured X-Y3 capacitance is also 30 units. The normalized measured capacitance for X-Y1, X-Y2, and X-Y3 is 1, 13, and 0 units, respectively, and a finger touch is detected at the X-Y2 combination. Normalization is done by subtracting all the capacitance data with the lowest value in the X axis (X-Y1, X-Y2, X-Y3); this process eliminates the capacitance introduced by the finger to the sensor line and shows the change in the cross-capacitance in the location that is touched. In one active line (X) and N disturbance lines, the maximum number of keys that may be pressed is (N−1) keys. Hence, in the illustration above, the maximum number of keys that may be pressed is two. In an M×N matrix, wherein M is the number of lines in the X-axis and N is the number of lines in the Y-axis, and assuming the maximum number of channels affected by a touch is three, the maximum number of touches allowed in a single X-line is (N/3−1).

Figure 28:
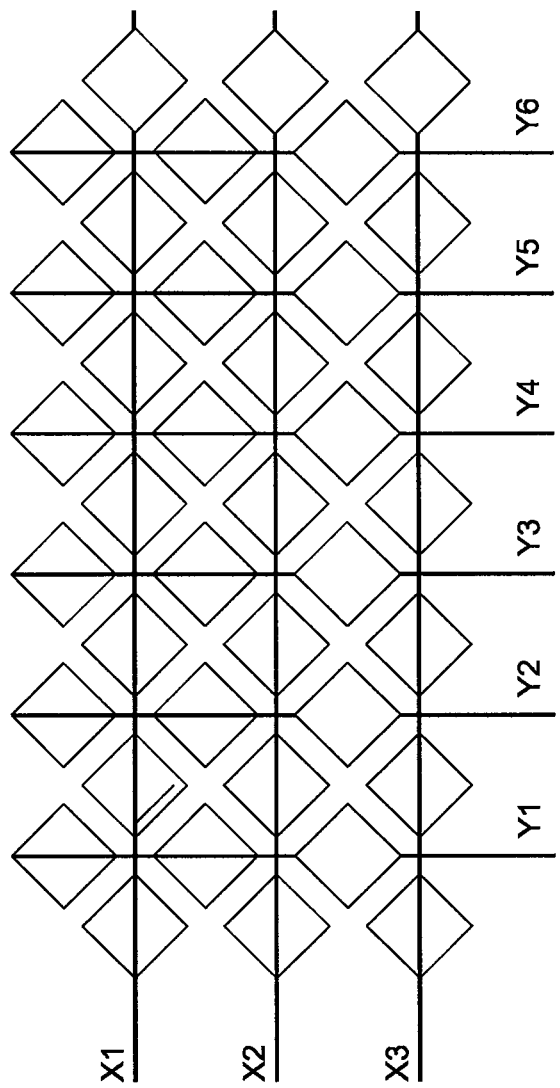
FIG. 28 is a diagram of a 6×6 diamond shape projected capacitance touch screen sensor used in an experiment to test the disturbance sensing method according to the present invention.

Although in delay-based capacitance sensing a normal one channel to one key configuration is the best option, a matrix configuration may also be considered. Although in a matrix method implementation in a projective capacitive touch screen sensor enables definition of multi-touch locations without the presence of "ghost-touch". A 6×6 diamond shape matrix configuration 2800 is shown in FIG. 28 that was used in an experiment to test the disturbance sensing method of the present invention. Data acquisition of matrix touch-pad/screen can be done by sweeping the measurement axis one by one, or by interleaved sweeping. For example, X-axis sweeping and disturbance sweeping sequence is set forth as follows: X1-Y1, X1-Y2, . . . , X1-Y6, X2-Y1, X2-Y2, . . . , X2-Y6, . . . , X6-Y1, X6-Y2, . . . , X6-Y6. The interleaved sweeping sequence is set forth as follows: X1-Y1 & X3-Y1 & X5-Y1, X1-Y2 & X3-Y2 & X5-Y2, . . . , X1-Y6 & X3-Y6 & X5-Y6, X2-Y1 & X4-Y1 & X6-Y1, X2-Y2 & X4-Y2 & X6-Y2, . . . , X2-Y6 & X3-Y6 & X6-Y6.

Figure 26:
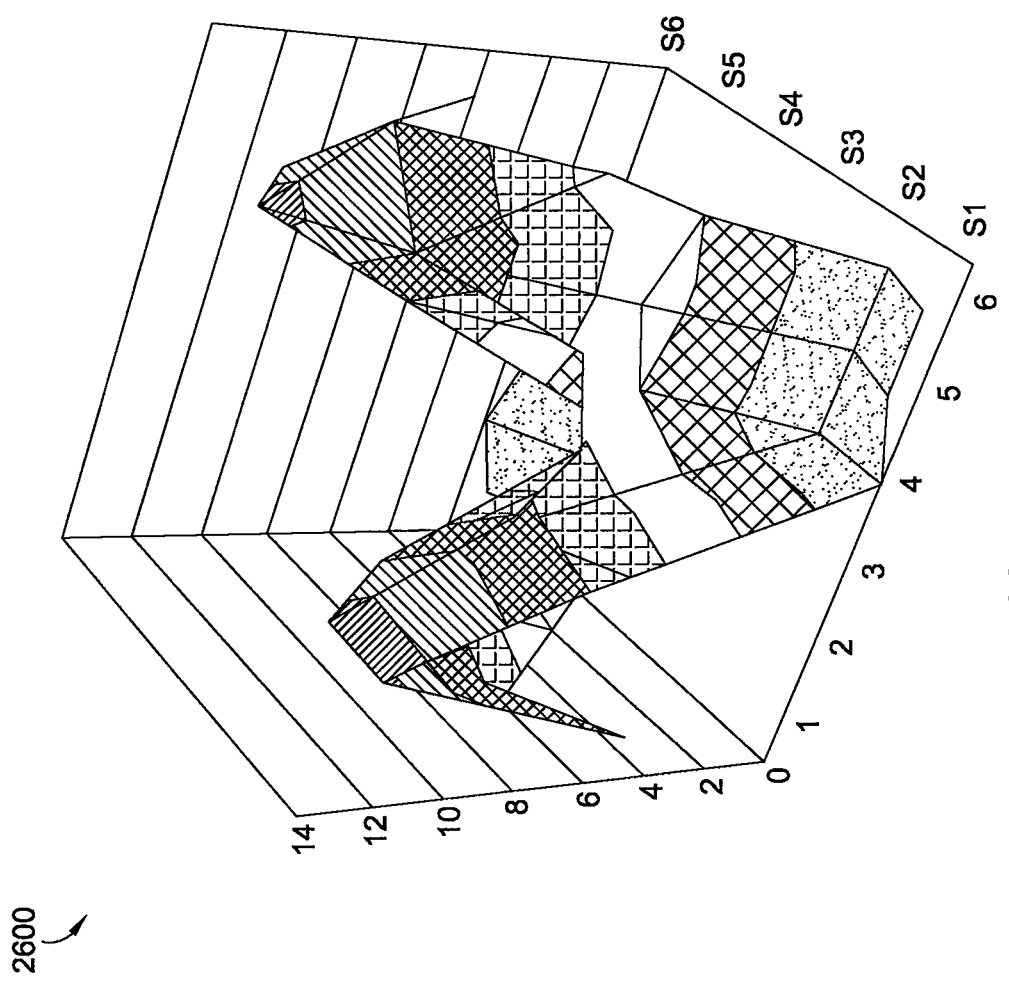
Figure 27:
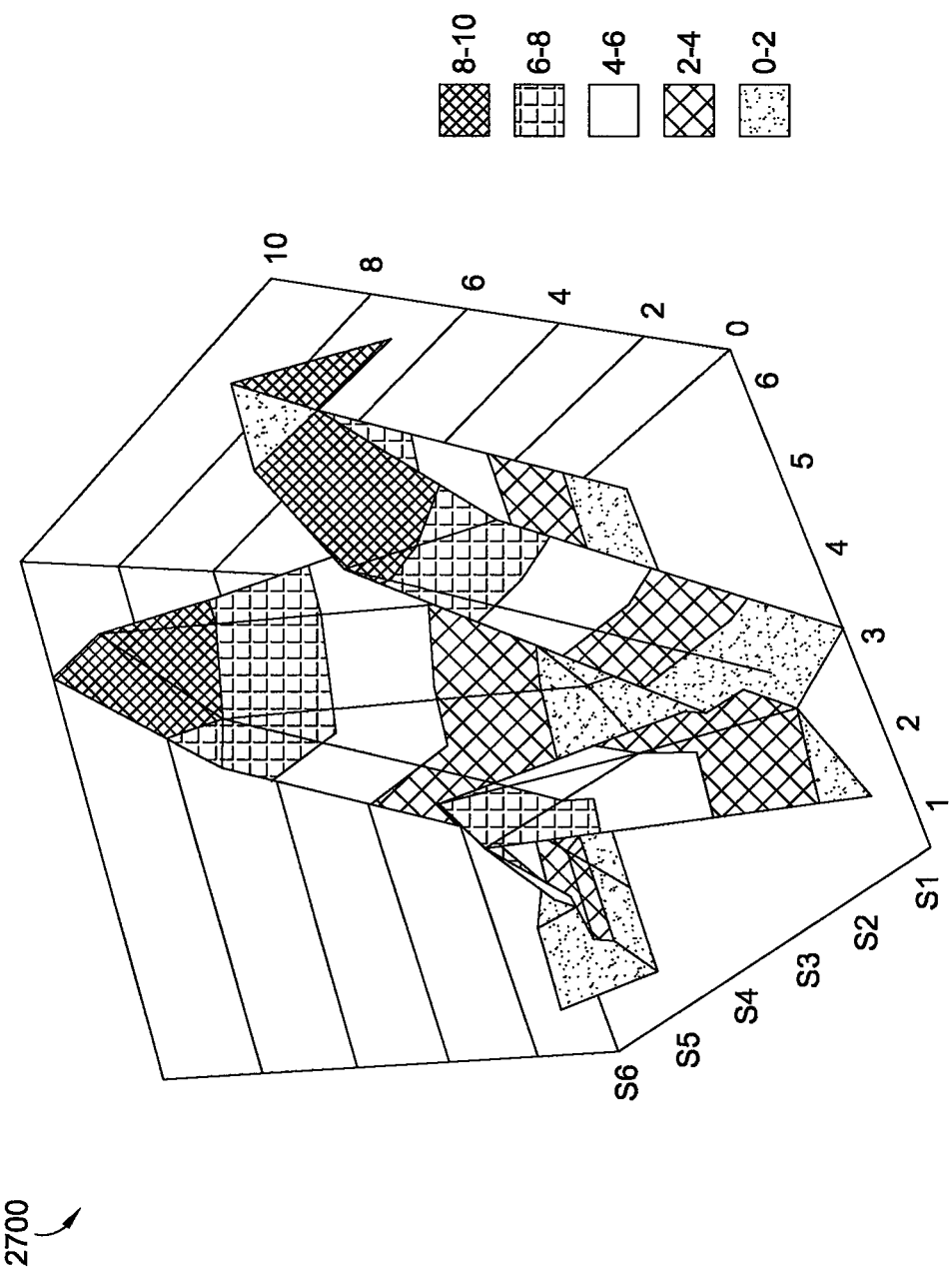

The experimental results for the disturbance method according to the present invention is shown in FIGS. 25-27. A single-touch charge profile 2500 on the 6×6 diamond shape matrix configuration is shown in FIG. 25. A dual-touch charge profile 2600 on the same 6×6 diamond shape matrix configuration is shown in FIG. 26. Finally, a triple-touch charge profile 2700 on the same 6×6 diamond shape matrix configuration is shown in FIG. 27.

With respect to FIGS. 21-28, a method of matrix sensing using delay chain-based capacitance sensing has been shown according to the present invention, wherein the X-axis lines act as active lines which do measurements and Y-axis lines act as a disturbance to locate the location of a touch in a key matrix. An application of the method discussed above is in key-matrix and position sensing applications (for either touch-pad or touch-screen applications), which allows multi-touch detection.

Referring again to FIG. 2, a differential delay quantization technique is described that can be used as a specific implementation of block 212 entitled "Time to Digital Converter". The differential delay quantization technique of the present invention is also further described with respect to FIGS. 29 and 30.

Prior art delay quantization methods are based on the arrival of a measuring signal and a reference signal at each of a plurality of capturing memory cells. The minimum delay quantum (quantization precision) of such prior art circuits is usually limited by the speed of the process technology used. Reducing the delay quantum to improve quantization precision requires increasing the measuring signal delay chain and thereby cost.

Figure 29:
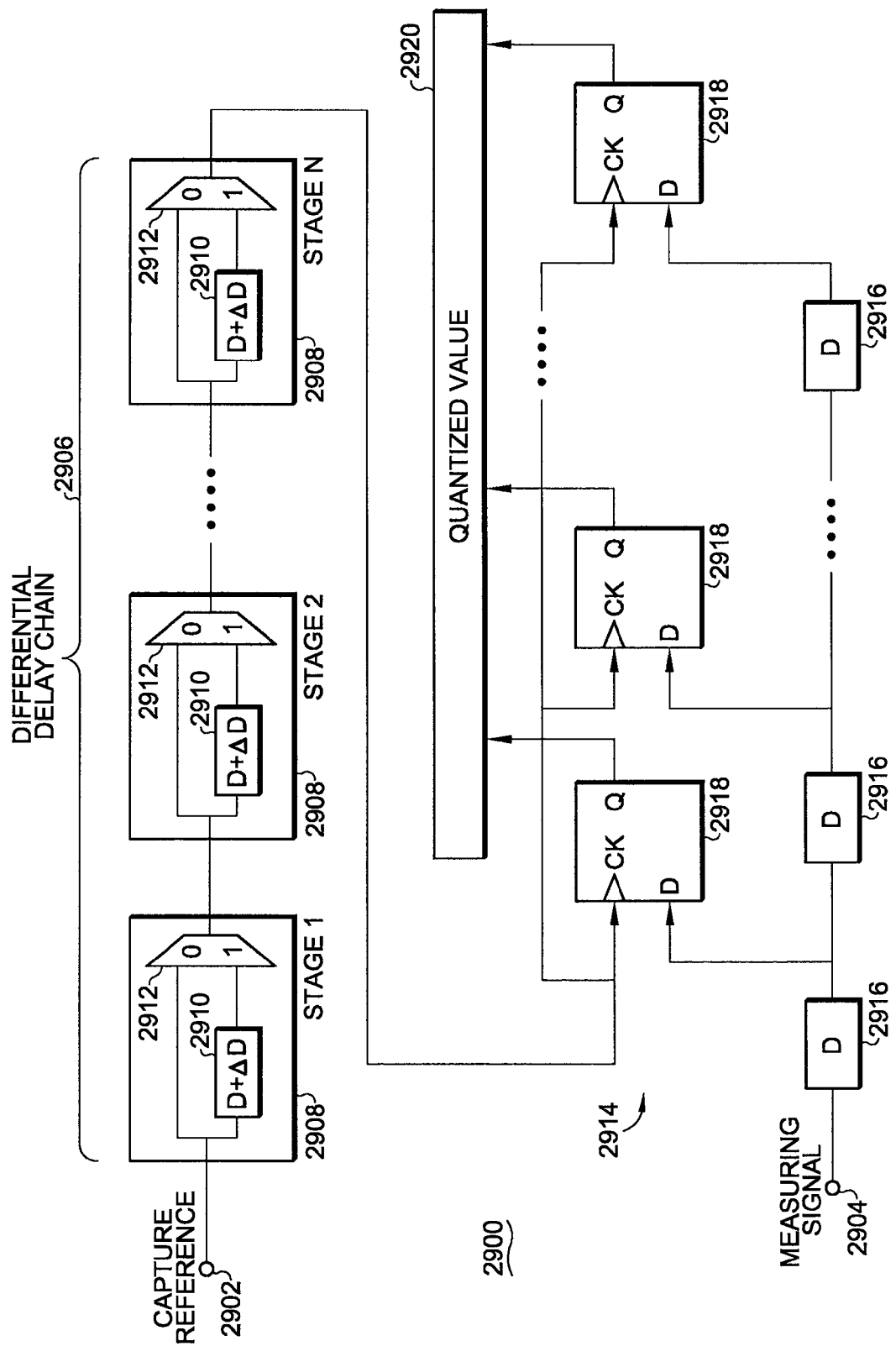
FIG. 29 is a schematic diagram of a specific circuit embodiment of the time-to-digital converter block shown in FIG. 2.

Referring now to FIG. 29, a new differential delay quantization method and corresponding time-to-digital converter circuit 2900 according to the present invention is shown. Time-to-digital converter 2900 includes a first delay chain 2906 having an input for receiving a capture reference signal 2900, and an output. A second delay chain 2914 has a first input coupled to the output of the first delay chain 2906, a second input for receiving a measuring signal 2904, and an output for providing a digital quantized value to register 2920. The incremental delay of the first delay chain 2906 (D+ΔD) is greater than an incremental delay (D) of the second delay chain 2904. The first delay chain 2906 includes a plurality of serially coupled delay stages 2912. Each delay stage 2912 includes a delay element 2910 having an input coupled to an input of the delay stage, and an output. A multiplexer 2912 has a first input coupled to the input of the delay stage, a second input coupled to the output of the delay element, a control input for receiving a control signal, and an output coupled to the output of the delay stage. The delay element 2910 can be a buffer stage or an inverter, or other of many known delay elements. A second delay chain 2914 also includes a plurality of serially coupled delay stages. Each delay stage includes a D-type flip-flop 2918 having a clock input for receiving a clock signal, a D input, and an output for providing a digital quantized value. A delay element 2916 is coupled to the D input of the D-type flip-flop 2918. The delay element 2916 can also be a buffer stage, inverter, or any other known delay element. Note in FIG. 29 that the delay of delay element 2910 is slightly larger than the delay of delay element 2916, by about 10% in a preferred embodiment.

The capture reference signal 2902 is delayed in each step by a quantum (D+ΔD) which is slightly larger than the measuring signal 2904 quantum delay (D) as shown in FIG. 29. The difference in the quantum of the capture reference and the measuring signal (ΔD) gives the effective precision of the quantization, according to the present invention. This quantization precision (ΔD) is computed by selecting the number of subdivisions (N) required within D, wherein ΔD=D/N.

Figure 30:
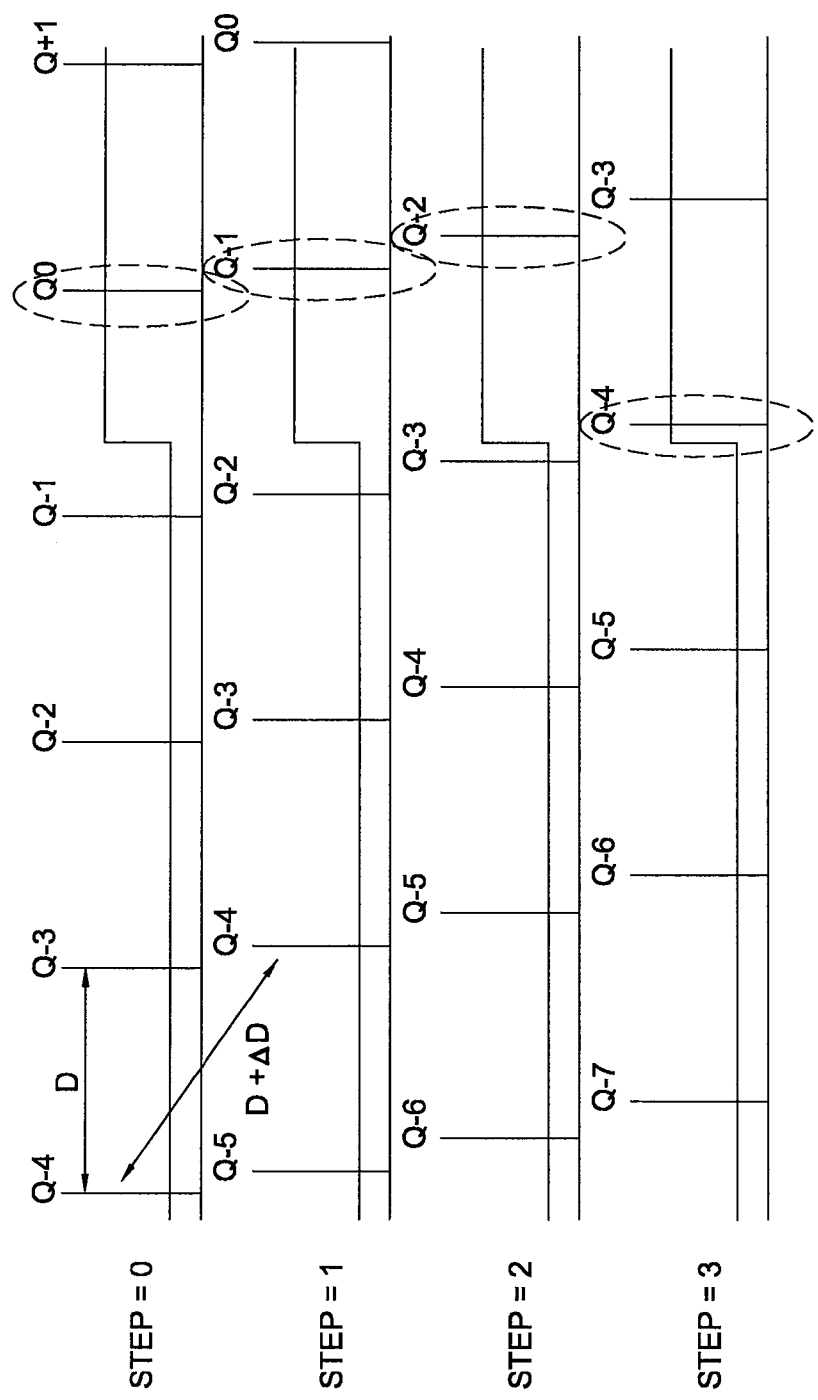
FIG. 30 is a timing diagram associated with the time-to-digital converter circuit shown in FIG. 2.

The differential delay quantization process is described below with respect to FIG. 30. Each Quantization is completed in a number of steps.

Step 0: All stages of the differential delay chain 2906 receiving the capture reference signal 2902 are by-passed. The first quantized value (Q0) is stored.

Steps 1-N:

Step 1—Stage 1 of the differential delay chain 2906 is turned on. If the new quantization value is one less than the previous step then proceed to the next step with each respective stage of the differential delay chain turned on. If the new quantized value is two less than previous step quantized value, the current step number (S) is noted. The final quantized value=Q−1+(S×ΔD/D). The maximum number of steps in each quantization is N. If there is no decrement of two in quantized value found in N steps, the final quantized value remains at Q−1.

The differential delay quantization technique of the present invention has several advantages. The present invention is able to provide higher precision without the need of reducing the delay of the delay elements. The present invention also obviates the need to go to faster and more expensive process technologies. The measuring delay chain 2914 need not increase in length linearly with higher precision.

In the art prior art, the differential delay between the measuring signal 2904 and the capture reference signal 2902 is quantized in the flip-flops 2918. This is the same as the new circuit in step=0 when all stages in the differential delay chain 2906 are bypassed. In step=0, the quantized value is Q0. In Step=1, stage 1D+ΔD delay is turned on in the capture reference path, but the quantized value change is only one (Q0 to Q1). As long as the quantized value change is one, the capture reference is stepped up until the quantized value is changed by two in a step (example in FIG. 30, Q2 to Q4 in step=3). The final computed quantized value in the example is Q−1+3×ΔD. AD is, therefore, the smallest resolution of detection and D/AD is the number of stages of delay needed in the capture ref path.

The selection of the multiplexers 2912 are shown in the following Table V (selection 1=delay, 0=bypassed):

TABLE V

|  | Stage 1 mux | Stage 2 mux | ... | Stage N mux |
|---|---|---|---|---|
| Step 0 | 0 | 0 | ... | 0 |
| Step 1 | 1 | 0 | ... | 0 |
| Step 2 | 1 | 1 | ... | 0 |
| Step N | 1 | 1 | ... | 1 |

The design of the delay elements 2910 and 2916 can be readily accomplished using standard processes. The delay element is typically the fastest logic gate for a given process (normally an inverter or buffer stage). The delay through the inverter or buffer stage is dependent on the process technology used. For example, in 0.18 μm technology, the faster delay element is about 200 ps (D). In the new technique of the present invention, it is not necessary to migrate to smaller and more expensive processes to achieve better resolution. For example, in 0.18 μm technology, a delay element in the capture reference can be chosen to be 10% larger in delay–220 ps (D+ΔD). Ten stages of D+ΔD delay in the capture reference path are needed to detect a resolution of 20 ps. It is known in the art how to create a 10% relative delay between two delay elements. For example, in a buffer stage, the size of the appropriate signal path transistors are chosen such that the desired increased delay is provided. The correlation between transistor size and parasitic capacitance and delay is well established.

Having described and illustrated the principle of the invention in a preferred embodiment thereof, it is appreciated by those having skill in the art that the invention can be modified in arrangement and detail without departing from such principles. Although a preferred method and circuit has been shown, the exact details of the preferred method and circuit can be changed as desired as required for a particular application. For example, for a plurality of serially-coupled elements in a delay chain, it will be appreciated by those skilled in the art that additional or fewer of such serially-coupled elements can be used as desired for a particular application, and the scope of the invention is not limited by the exact number of serially-coupled elements shown in the drawing figures. Similarly, while a sensor has been shown containing a specific number of X-axis lines and Y-axis lines, it will be appreciated by those skilled in the art that M X-axis lines and N Y-axis lines can be used in an M×N matrix, where M and N are integers. In addition, the circuits and block diagrams shown in the drawing figures are meant to be exemplary of the present invention and can be modified as desired for a particular application. We therefore claim all modifications and variations coming within the spirit and scope of the following claims.

We claim:

1. A time-to-digital converter comprising:
    a first delay chain having an input for receiving a capture reference signal, and a final output; and
    a second delay chain having a first input coupled to the final output of the first delay chain, a second input for receiving a measuring signal, and an output for providing a digital quantized value,
    wherein an incremental delay of the first delay chain is greater than an incremental delay of the second delay chain.

2. The time-to-digital converter of claim 1, wherein the first delay chain comprises a plurality of serially coupled delay stages.

3. The time-to-digital converter of claim 2, wherein each delay stage comprises:
    a delay element having an input coupled to an input of the delay stage, and an output; and
    a multiplexer having a first input coupled to the input of the delay stage, a second input coupled to the output of the delay element, a control input for receiving a control signal, and an output coupled to the output of the delay stage.

4. The time-to-digital converter of claim 3 wherein the delay element comprises a buffer stage.

5. The time-to-digital converter of claim 3 wherein the delay element comprises an inverter.

6. The time-to-digital converter of claim 1, wherein the second delay chain comprises a plurality of serially coupled delay stages.

7. The time-to-digital converter of claim 6, wherein each delay stage comprises:
    a D-type flip-flop having a clock input for receiving a clock signal, a D input, and an output for providing a digital quantized value; and
    a delay element coupled to the D input of the D-type flip-flop.

8. The time-to-digital converter of claim 7, wherein the delay element comprises a buffer stage.

9. The time-to-digital converter of claim 7, wherein the delay element comprises an inverter.

10. The time-to-digital converter of claim 1, wherein the incremental delay of the first delay chain is a predetermined percentage greater than the incremental delay of the second delay chain.

11. A touch pad or touch screen system comprising:
    a plurality of X-axis lines used as active lines for capacitance measurements;
    a plurality of Y-axis lines used as a disturbance to identify the location of a touch in a key matrix;
    a capacitance-to-time converter coupled to the plurality of X-axis and Y-axis lines; and
    a time-to-digital converter coupled to the capacitance-to-time converter, wherein the time-to-digital converter comprises a first delay chain having an input for receiving a capture reference signal, and a final output, and a second delay chain having a first input coupled to the final output of the first delay chain, a second input for receiving a measuring signal, and an output for providing a digital quantized value, wherein an incremental delay of the first delay chain is greater than an incremental delay of the second delay chain.

12. The system of claim 11, wherein the first delay chain comprises a plurality of serially coupled delay stages.

13. The system of claim 12, wherein each delay stage comprises:
    a delay element having an input coupled to an input of the delay stage, and an output; and
    a multiplexer having a first input coupled to the input of the delay stage, a second input coupled to the output of the delay element, a control input for receiving a control signal, and an output coupled to the output of the delay stage.

14. The system of claim 13 wherein the delay element comprises a buffer stage.

15. The system of claim 13 wherein the delay element comprises an inverter.

16. The system of claim 11, wherein the second delay chain comprises a plurality of serially coupled delay stages.

17. The system of claim 16, wherein each delay stage comprises:
    a D-type flip-flop having a clock input for receiving a clock signal, a D input, and an output for providing a digital quantized value; and
    a delay element coupled to the D input of the D-type flip-flop.

18. The system of claim 17, wherein the delay element comprises a buffer stage.

19. The system of claim 17, wherein the delay element comprises an inverter.

20. The system of claim 11, wherein the incremental delay of the first delay chain is a predetermined percentage greater than the incremental delay of the second delay chain.

21. A time-to-digital converter comprising:
    a reference delay chain having an input for receiving a capture reference signal, and a final output; and
    a measurement delay chain having a first input coupled to the final output of the reference delay chain, a second input for receiving a measuring signal, and an output for providing a digital quantized value, wherein an incremental delay of the reference delay chain is greater than an incremental delay of the measurement delay chain.

* * * * *